(12) United States Patent
Smith

(10) Patent No.: US 8,088,263 B1
(45) Date of Patent: Jan. 3, 2012

(54) PHASED MAGNETIC CATHODE

(76) Inventor: Robert M. Smith, Placerville, CA (US)

( * ) Notice: Subject to any disclaimer, the term of this patent is extended or adjusted under 35 U.S.C. 154(b) by 460 days.

(21) Appl. No.: 12/372,562

(22) Filed: Feb. 17, 2009

(51) Int. Cl.
*C23C 14/35* (2006.01)
*C23C 14/54* (2006.01)
*C23C 14/56* (2006.01)

(52) U.S. Cl. ........... 204/298.08; 204/298.16; 204/298.2; 204/298.22

(58) Field of Classification Search .............. 204/298.08, 204/298.16, 298.2, 298.22
See application file for complete search history.

(56) References Cited

U.S. PATENT DOCUMENTS

| | | | |
|---|---|---|---|
| 4,606,806 A | 8/1986 | Helmer | |
| 4,761,218 A | 8/1988 | Boys | |
| 4,931,158 A | 6/1990 | Bunshah | |
| 5,174,875 A * | 12/1992 | Hurwitt et al. ............. 204/298.2 |
| 6,103,074 A | 8/2000 | Khominich | |
| 6,488,824 B1 | 12/2002 | Hollars | |

* cited by examiner

*Primary Examiner* — Mark F Huff
*Assistant Examiner* — John S Ruggles
(74) *Attorney, Agent, or Firm* — John P. Costello; Costello Law Corp.

(57) ABSTRACT

The present invention is a device for controlling sputter coating deposition to at least one surface of at least one substrate. The device includes a magnetic structure having a plurality of electrically isolated and magnetically coupled magnetic pole piece structures. A plurality of magnetic concentric rings is mounted behind at least one target surface. A central upright common magnetic core connects the plurality of magnetic pole piece structures. A plurality of upright pole pieces arranged parallel to each other is attached to each of the magnetic pole piece structures and arranged at midpoints of the plurality of magnetic concentric rings. The magnetic structure includes a plurality of electromagnetic coils wound over the plurality of magnetic pole piece structures arranged to form sets of coils. The sets of coils can be energized in forward or reverse mode thereby impacting the target at a greater angle resulting in higher angle particle ejection.

39 Claims, 27 Drawing Sheets

PHASED MAGNETIC CATHODE

CROSS-REFERENCE TO RELATED APPLICATIONS

Not Applicable.

STATEMENT REGARDING FEDERALLY SPONSORED RESEARCH AND DEVELOPMENT

Not Applicable.

TECHNICAL FIELD

This invention relates to the field of sputter coating sources and, more particularly, to a device that controls sputter coating deposition for providing higher angle target particle ejection and achieving a uniform deposition of target material onto a substrate.

DISCUSSION OF RELATED ART

Sputter coating devices with magnetron arrangements characterized by crossed electric and magnetic fields in a vacuum chamber into which an inert, ionizable gas, such as argon, may be introduced. The gas is ionized by electrons accelerated by the electric field. The magnetic field confines the ionized gas, which forms a plasma in proximity to a target structure. The gas ions strike the target structure causing emission of atoms incident on a substrate while coating. Generally, the magnetic field is established by a permanent magnet structure, although increasingly electromagnetic devices are being employed for this purpose. Yet conventional magnetron sputtering devices have considerable drawbacks, principally being that they have failed to properly utilize the target material and to provide uniformity and conformance of the deposited coating.

U.S. Pat. No. 4,606,806 issued to Helmer on Aug. 19, 1986 provides a magnetron vacuum sputtering device for causing material from a target assembly to be sputtered onto a workpiece and includes a target means with a first target having a material emitting surface and a second target initially having a concave emitting surface. The vacuum sputtering device includes a source for supplying an ionizable gas to a space adapted to be evacuated. The space is between the target assembly and a workpiece on which atoms from the target assembly are to be coated or which is to be etched. An ionizing electric field is provided for the gas in the evacuated space. A confining magnetic field for the gas ionized by the electric field is provided in the vicinity of the emitting surfaces of the first and second targets. The targets are mounted so that emitted material is sputtered from the concave emitting surface outside of the first target. However such a vacuum sputtering device includes target configurations that has inner and outer targets which is concave and the particle ejection typically occurs at a common inclination angle.

U.S. Pat. No. 4,761,218 to Boys on Aug. 2, 1988 reveals a sputter coating source having separate annular targets spaced outwardly from each other around a central axis. Magnetic field generating means are provided to establish magnetic field lines over each target around an annular path. Each target has its own separate magnetic field generating means including an electromagnet having a separately controllable power supply whereby the strength of the magnetic field over each target may be separately controlled. The targets may be made of magnetic material. The source structure thus described herein requires a separately controlled power supply for the plasma power for each target.

U.S. Pat. No. 4,931,158 issued to Bunshah on Jun. 5, 1990 provides an apparatus and process for reactive magnetron sputtering wherein film deposition is controlled by placing a grid located over the primary plasma and an auxiliary plasma adjacent to the substrate. The modified reactive magnetron sputtering apparatus and process disclosed provides for synthesis of good quality transparent conducting coatings onto a large area, heat sensitive substrates. Two distinct plasma zones carry out the reactive sputtering process wherein one plasma zone is primary plasma localized over the magnetron target material and the other is auxiliary plasma localized near the substrate to control the growth and properties of the deposited film. Such a device requires an additional wire grid having a pre-selected open area to be placed across the top of a mini-chamber for controlling the flow of sputtered material from the primary plasma toward the substrate.

One prior art device, taught in U.S. Pat. No. 6,103,074 issued to Khominich on Aug. 15, 2000 discloses an apparatus and method for enhancing a stream of plasma particles created by a cathode arc vapor deposition process. The apparatus is designed to control the plasma particles by trapping the plasma particles generated from a sacrificial cathode plasma source and focus the plasma particle stream to collide with and deposit upon a substrate to be coated. The apparatus includes a magnetic field generator for generating a magnetic field of a distinctive cusp shape. An anode is insulated from a chamber to strengthen and sharpen the electric field potentially created in the chamber. However, the device is in need of two additional anti-parallel magnetic field generators for producing distinctive magnetic fields and a plasma generator assembly for the plasma deposition coating.

U.S. Pat. No. 6,488,824 issued to Hollars on Dec. 3, 2002 discloses a sputtering apparatus and method for high rate deposition. A set of vertically mounted, dual and triple rotatable cylindrical or planar magnetrons with associated vacuum pumps form semi-isolated sputtering modules. The sputtering modules can be independently controlled for the sequential deposition of layers of similar or different materials. The apparatus may take the form of a circular arrangement of modules for batch coating of wafer-like substrates, or the modules may be arranged linearly for the coating of large planar substrates. Such a device includes a rotary cathode and it may burn through the target at the areas near the end due to the wrapping of magnetic field.

Therefore, there is a need for a device for controlling sputter coating deposition to at least one surface of at least one substrate including a set of electromagnetic coils having forward, reverse, and reverse null windings that could be energized in different combinations resulting in higher angle particle ejection contributing to a greater utilization of the target material. Moreover, such a device would facilitate phased operation in different modes thereby achieving a uniform deposition of target material on at least one surface of the target substrate. The present invention accomplishes these objectives.

SUMMARY OF THE INVENTION

The present invention is a device for controlling sputter coating deposition to at least one surface of at least one substrate. The device includes a magnetic structure having a plurality of electrically isolated and magnetically coupled magnetic pole piece structures arranged in spoke fashion. The magnetic structure includes at least one target surface having a mounting means for positioning at least one target. A plurality of magnetic concentric rings is mounted behind at least one target surface. A central upright common magnetic core traversed along a longitudinal axis connects the plurality of magnetic pole piece structures. A plurality of upright pole pieces arranged parallel to each other is attached to each of the magnetic pole piece structures and arranged at midpoints of the plurality of magnetic concentric rings.

The magnetic structure is mounted with at least one target and a plurality of electromagnetic coils wound over the plurality of magnetic pole piece structures arranged to form 4 sets of coils like C1, C2, C3 and C4. Arrangement of the central upright common magnetic core, the plurality of upright pole pieces and the plurality of magnetic concentric rings facilitate forming the magnetic field lines above the target surface. The dimensions of the plurality of magnetic concentric rings are calculated to give equal areas and equal air gaps with the inner most ring 1 at one-half the common area of the plurality of rings 2, 3, and 4 and the outer most ring 5 area one-half the common area of the rings 2, 3, and 4. When the plurality of magnetic field lines are bridged between the pole rings 2 and 3 the coil set 2 (C2) is energized and coil set 1 and 3 (C1 and C3) are reverse biased. The magnetic structure generates parabolic magnetic field lines that get influenced by the plasma generation field resulting to create a magnetic field line shape that is more parallel than parabolic relative to the flat surface of a target.

A plurality of components of magnetic field lines are formed when energizing is transferred from coil set 2 to coil set 1. The magnetic field lines formed during transition from coil set 2 to coil set 1 are of three components. One component may be formed between pole rings 2 and 3 and another component between pole rings 1 and 2. In addition, there is yet another component generated between pole rings 1 and 3 which results a substantially parallel magnetic field relative to the target surface. The nature of the plurality of magnetic field lines is influenced by the unique common area structured pole rings and the electromagnetic manipulations.

When coil set 1 is energized and coil set 2 is reverse biased a plurality of magnetic field lines are bridged across pole rings 1 and 2. The magnetic field strength formed above the target when coil set 2 is energized, during the transition from coil set 2 to coil sell and when coil set 1 is energized are all identical in strength. This uniform field is important in that it allows transitions without variations in the plasma density. When the coil sets 1, 2, 3, and 4 generally indicated as C1, C2, C3 and C4 are energized, the plurality of magnetic field lines generated above the target is a component of fields that are uniform and parallel to target surface. Each coil 1-4 would have forward, reverse and reverse null windings. Typically there are 150 turns for forward magnetic field generation and 68 turns for reverse field generation and 7 turns for reverse field null generation. The forward windings are to generate the main magnetic field. The reverse windings are used to confine the field of the neighbor magnetic field. The reverse null winding is used to null fringing fields from outer rings that may cause an adverse impact on the parallel nature of magnetic flux.

The target may be charged to a required potential using a power supply. When the magnetic field lines are phased or moved across the target, the magnetic field lines become an influence on the electrons leaving the target surface. The motion of the magnetic field lines will cause a spin state in the electrons around a portion of the vertical field line component. The spin electrons collide with free gas, typically argon. This collision results in ionized argon molecules created by the accelerated electrons, impacting the target at a greater angle than normal and result in higher angle particle ejections. The control of the higher angle ejected particles accomplishes higher levels of deposition uniformity and greater target area utilization.

The rotation of the plurality of magnetic field lines controls the electron spin acceleration. The direction of the plurality of magnetic field lines arranged in a manner that is concentric around a centerline perpendicular to the target will cause added or reduced acceleration of electrons along the plurality of field lines. The electrons are accelerated not only in the parallel field lines but also in the vertical field lines. The result is an augmentation or reduction in the ion generation and plasma density relative to rotational speed and rotational direction. A logic controlled power supply drives the device designed for controlling sputter coating deposition and includes a circuit for output current regulation. The logic controlled power supply manages the current flowing through the plurality of electromagnetic coils. The level of control of the logic controlled power supply may be achieved through hardwired analog logic or through the use of digital logic and digital to analog converters. The output current regulation is through power transistors, one circuit for each coil set. The output current transistors are voltage controlled with current compensation. The returning current is through another set of power transistors with current compensation feedback. This input or output regulation allows for individual voltage controlled current outputs as well as a common current control for all.

A phase oscillator circuit with end point integration consists of a frequency generator designed to produce a triangle wave output. The frequency is controlled by a manual capacitance selector and a variable resistor permitting a manual fixed position as well. The triangle wave is amplified to a 1-9 volt signal. A phased sweep logic ID/OD control circuit with end point integration can be used to control the innermost and outermost diameters the plasma will travel. The output of the oscillator circuit can be sent directly to the phase generation amplifiers or sent through an ID/OD control circuit. The end point integration allows the additional time at each end point to compensate for the two passes across the median points taken for every pass of an end point. A circuit with a series of operational amplifiers is designed to respond to selected voltage ranges.

A phased operation may function in at least one of a plurality of operational modes like a phased sweep mode, a uni-plasma mode, a uni-plasma with phased acceleration mode, a uni-plasma with amplitude modulation mode, and a uni-plasma with rotational acceleration mode.

DETAILED DESCRIPTION OF THE PREFERRED EMBODIMENT

Figure 1:
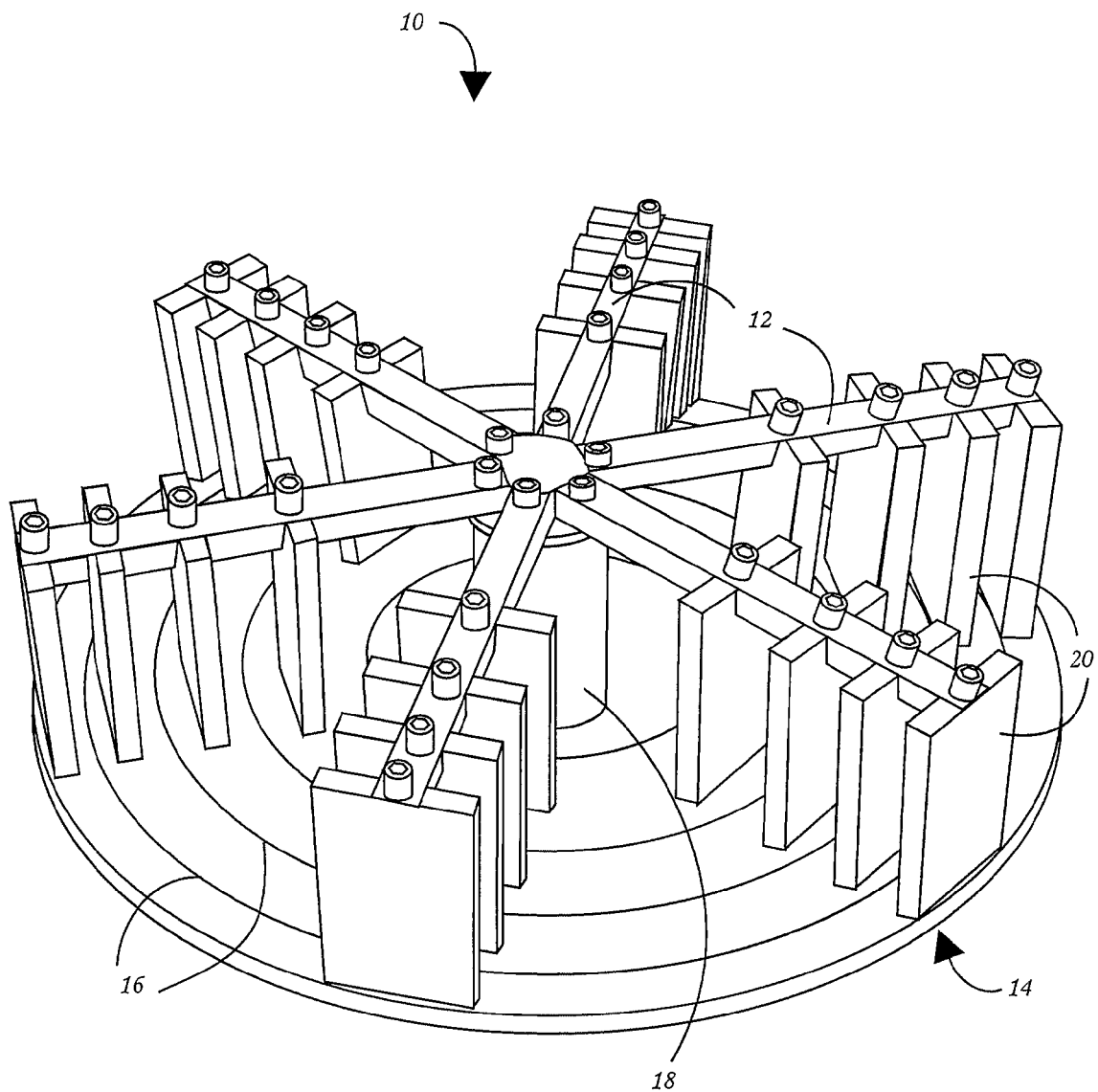
FIG. 1 is a perspective view of an electro magnetically controlled magnetic structure associated with the present invention.

Referring now specifically to the drawings, FIG. 1 shows a magnetic structure 10 associated with the inventive device having a plurality of electrically isolated and magnetically coupled magnetic pole piece structures 12 arranged in a spoke fashion for controlling sputter coating deposition to at least one surface of at least one substrate (not shown). The magnetic structure 10 includes at least one target surface 14 having a mounting means (not shown) for positioning at least one target 13. A plurality of magnetic concentric rings 16 is mounted behind the at least one target surface 14. A central upright common magnetic core 18 traversed along a longitudinal axis connects the plurality of magnetic pole piece structures 12. A plurality of upright pole pieces 20 arranged parallel to each other is attached to each of the magnetic pole piece structures 12 and arranged at midpoints of the plurality of magnetic concentric rings 16. The target 13 may be a non-magnetic or a magnetic material that utilizes a magnetic field for generating a plasma generation field that is sufficient to erode the target material.

Figure 2:
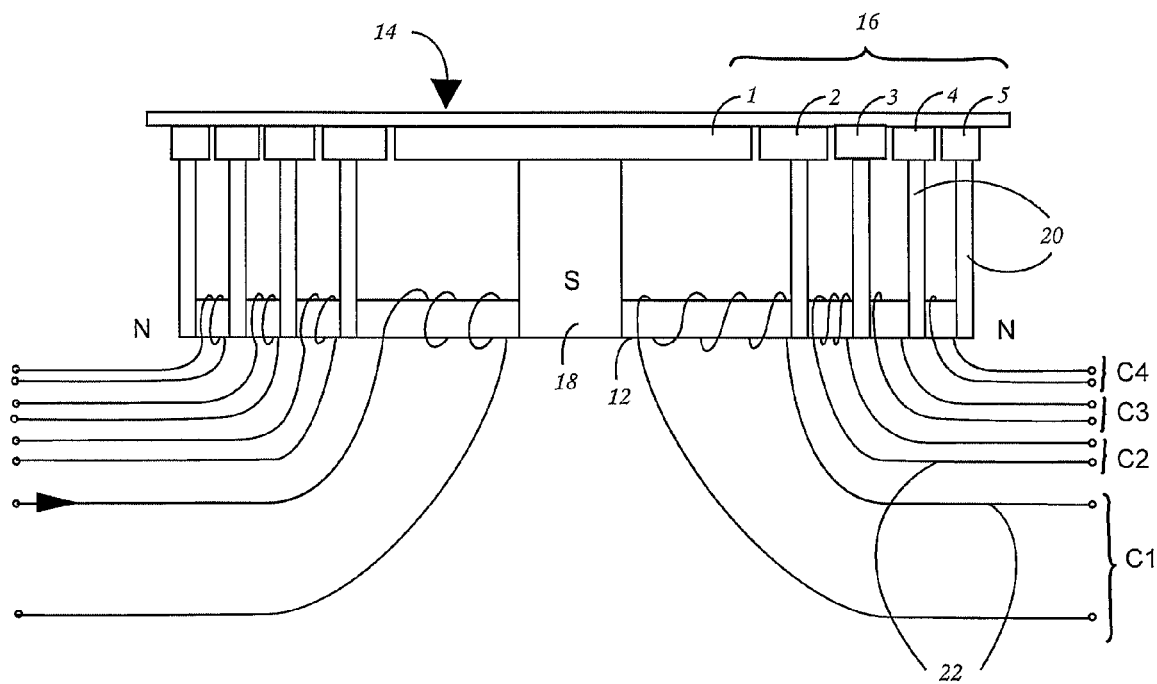
FIG. 2 is a cross sectional side view of the magnetic structure mounted with at least one target and a plurality of electromagnetic coils wound over a plurality of magnetic pole piece structures.

As shown in FIG. 2, the magnetic structure 10 is mounted with the at least one target 13 and a plurality of electromagnetic coils 22 wound over the plurality of magnetic pole piece structures 12 arranged to form 4 sets of coils like C1, C2, C3 and C4. Arrangement of the central upright common magnetic core 18, the plurality of upright pole pieces 20 and the plurality of magnetic concentric rings 16 facilitate forming the magnetic field lines above the target surface 14. The plurality of upright pole pieces 20, the plurality of magnetic concentric rings 16 and the plurality of magnetic pole piece structures 12 may be made from a magnetic type material such as metals, steel and the like.

Figure 3:
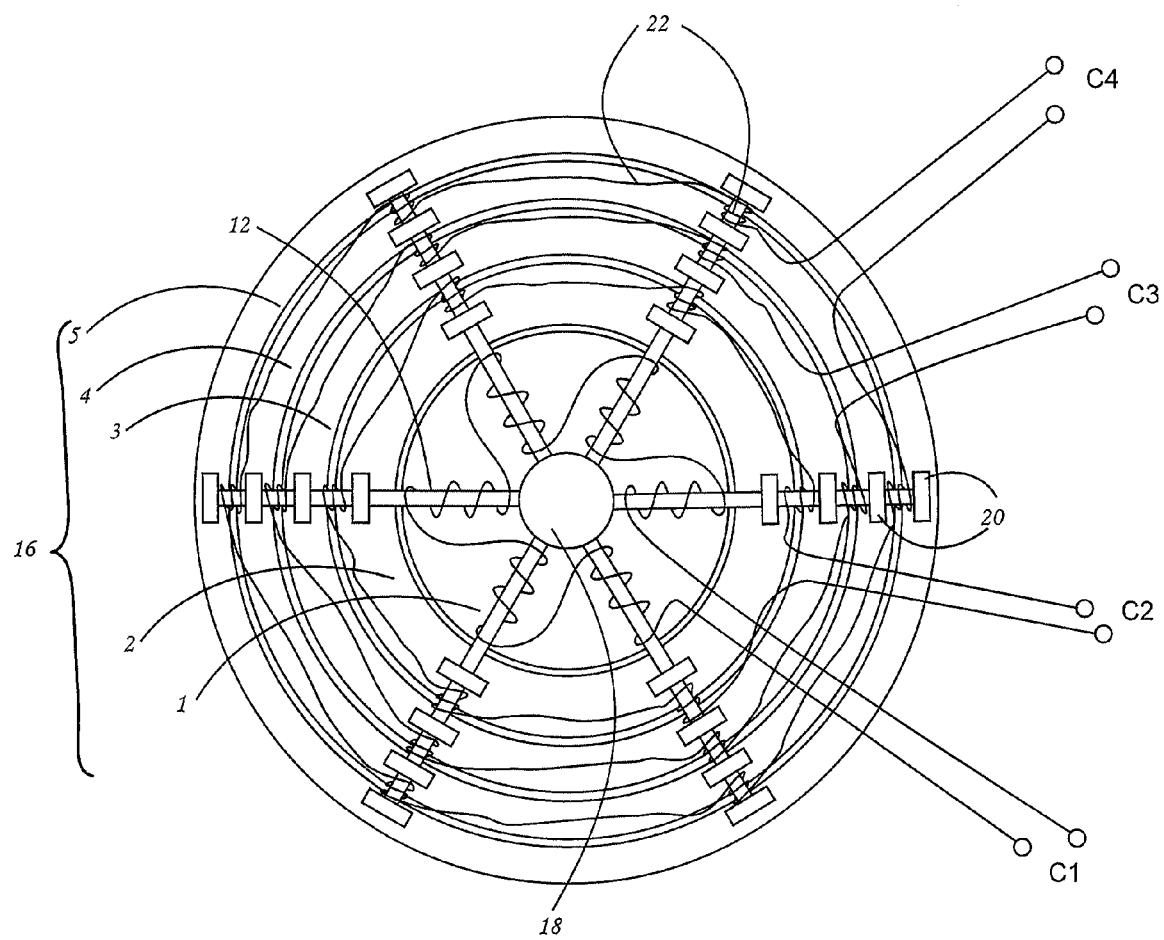
FIG. 3 is a top plan view of the magnetic structure, illustrating the winding of a plurality of electro magnetic coils on the magnetic structure.

FIG. 3 illustrates a winding of the plurality of electromagnetic coils 22 arranged in sets on the magnetic structure 10. The central upright common magnetic core 18 is a common pole piece to the plurality of magnetic pole piece structures 12. The plurality of magnetic concentric rings 16 having equal area results in equal per unit area density of magnetic flux. The dimensions of the plurality of magnetic concentric rings 16 are calculated to give equal areas and equal air gaps with the inner most ring 1 at one-half the common area of the plurality of rings 2, 3, and 4 and the outer most ring 5 area one-half the common area of the rings 2, 3, and 4. The air gap between each ring pair is calculated to be of equal area to each other. This relationship is critical in maintaining equal magnetic flux densities for each ring pair. The plurality of rings 16 may be flat or beveled shaped that influence the field shape and minimizing losses at the air gaps. The set of electromagnetic coils may incorporate additional windings that may be controlled independently.

The shape of the magnetic field may be adjusted along at least one diameter by variations in a plurality of ring coil levels resulting plasma over a large area and uniform in nature. At least one field can be created at various diameters along the ring structure. The field can be further confined or shaped by reverse fields in adjacent coils. This can erode preferentially the target surface 14. This can be used to deposit a plurality of thin films at different diameters on the substrate (not shown).

Figure 4:
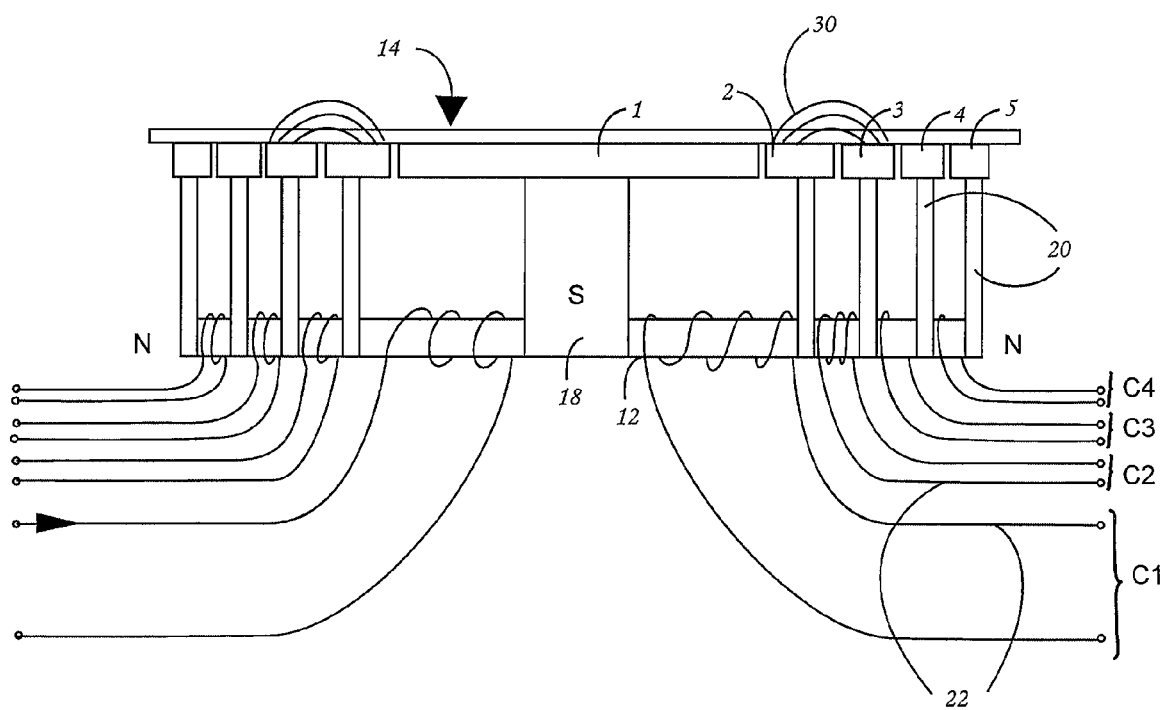
FIG. 4 is across sectional side view of the magnetic structure, illustrating a plurality of magnetic field lines extending over the target while energizing coil set 2.
Figure 5:
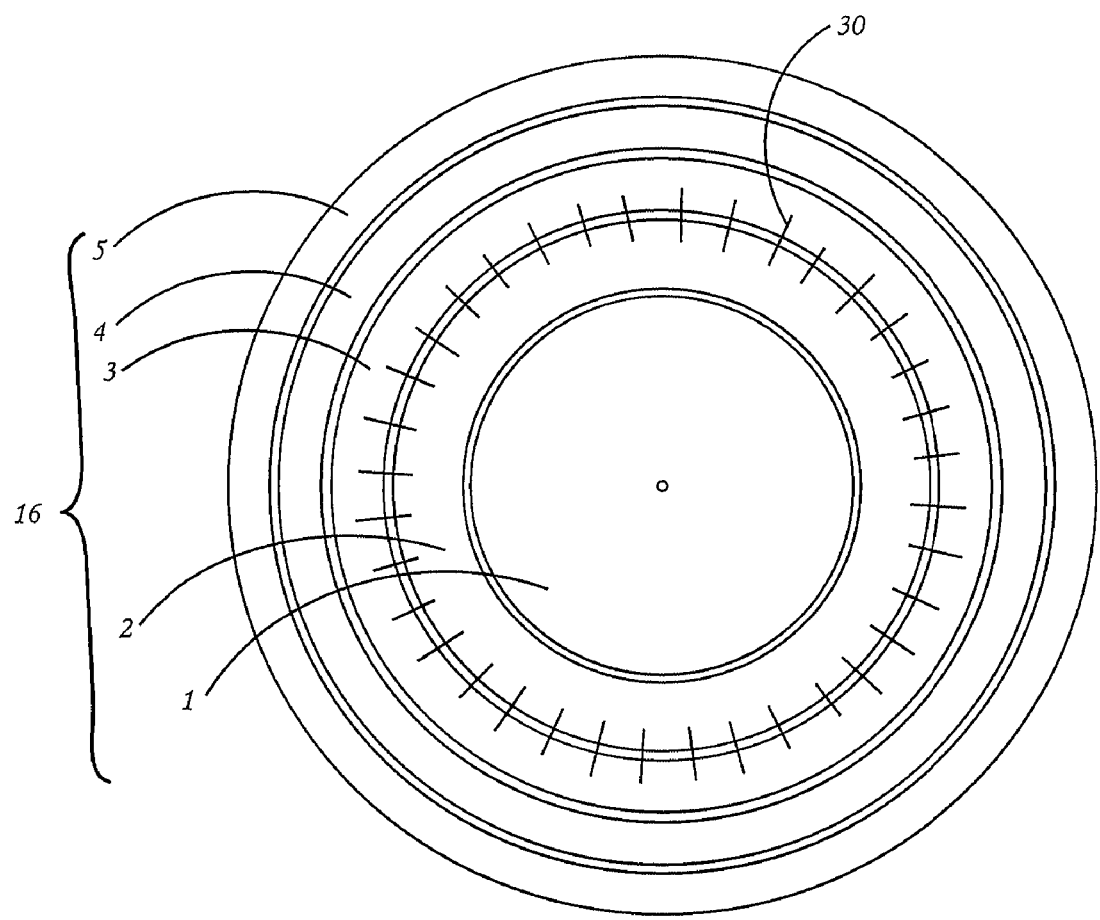
FIG. 5 is a bottom plan view of the magnetic structure, illustrating the plurality of magnetic field lines extending over the target when coil set 2 is being energized.

FIGS. 4 and 5 illustrate a plurality of magnetic field lines 30 extending over the target 13 while coil set 2 being energized and coil set 1 and 3 reverse biased. The plurality of magnetic field lines 30 are bridged between pole rings 2 and 3. The plasma generation field created by the spinning electrons is influenced in its shape by the energy levels of the electrons. The electron energies are influenced by the magnetic field lines, therefore the magnetic field lines directly dictate the shape of an ion sheath where the ion sheath refers to the collection of ionized gas molecules caused by impacting high-energy electrons. The plasma generation field in conjunction with a negative DC voltage potential on the target surface 14 forms a space charge accelerator. The direction or vector of the traveling ion is a result of the relative space charge effects. Typically, the magnetic structure 10 generates the parabolic magnetic field lines 30 above the target 13. The parabolic field lines 30 get influenced by the plasma generation field resulting to create a magnetic field line shape that is more parallel than parabolic relative to the flat surface of the target 13.

Figure 6:
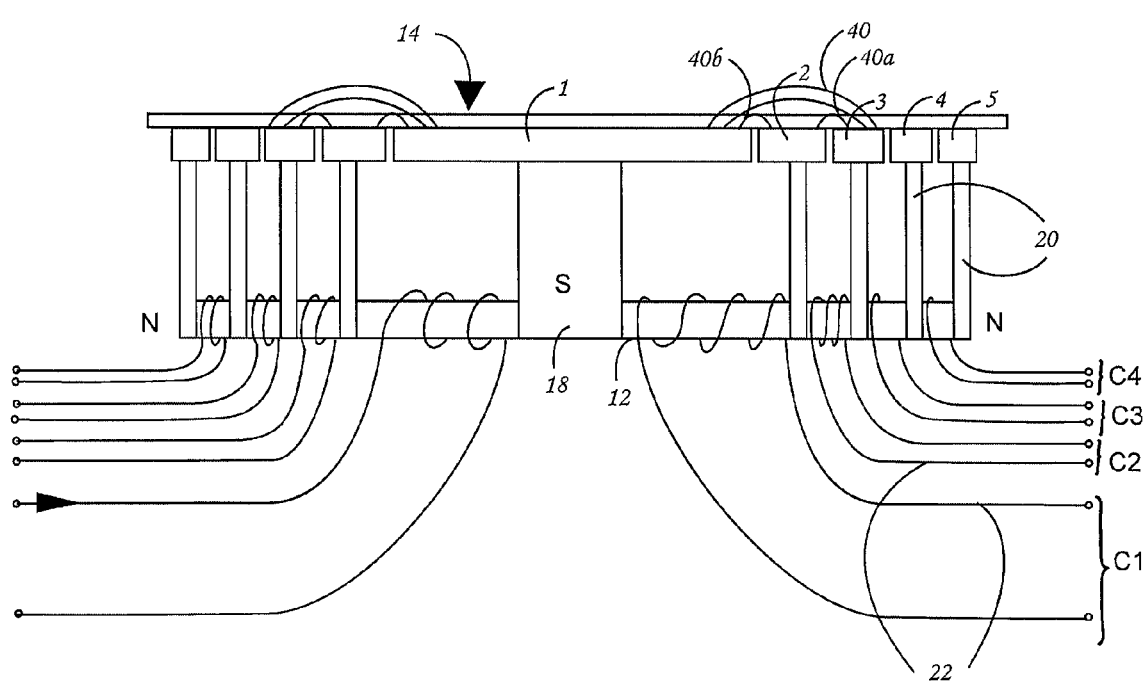
FIG. 6 is a cross sectional side view of the magnetic structure, illustrating a plurality of components of magnetic field lines formed when energizing is transferred from coil set 2 to coil set 1.
Figure 7:
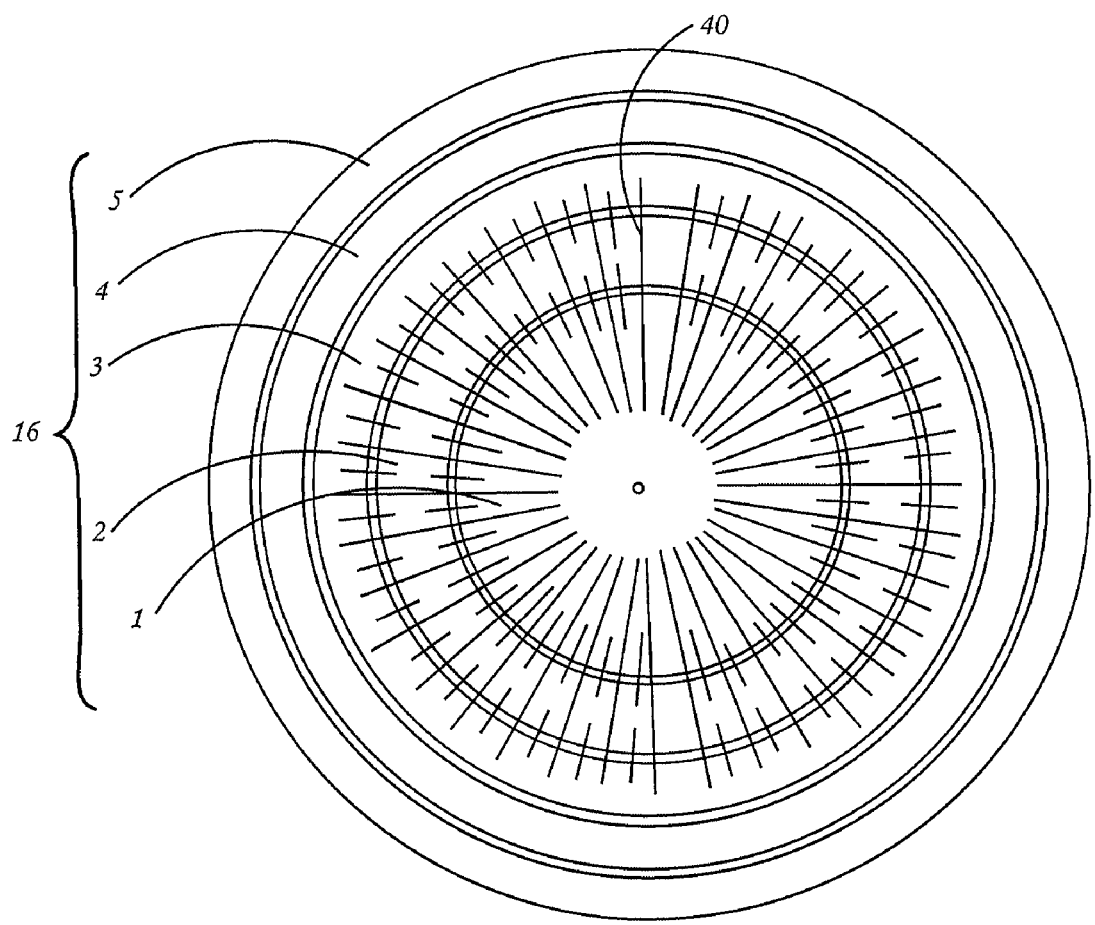
FIG. 7 is a bottom plan view of the magnetic structure, illustrating the plurality of magnetic field lines generated during transition from coil set 2 to coil set 1.

FIGS. 6 and 7 illustrate a plurality of components of magnetic field lines 40 formed when energizing transferred from coil set 2 to coil set 1. The magnetic field lines 40 formed during transition from coil set 2 to coil set 1 are of three components. One component 40*a* may be formed between pole rings 2 and 3 and other component 40*b* may be formed between pole rings 1 and 2. In addition, there is another component generated between pole rings 1 and 3 results in a substantially parallel magnetic field relative to the target surface 14. The nature of the plurality of magnetic field lines 40 is influenced by the unique common area structured pole rings and the electromagnetic manipulations. This transition is accomplished while maintaining the appropriate magnetic flux above the target 13 to maintain a steady state plasma discharge above the target material.

Figure 8:
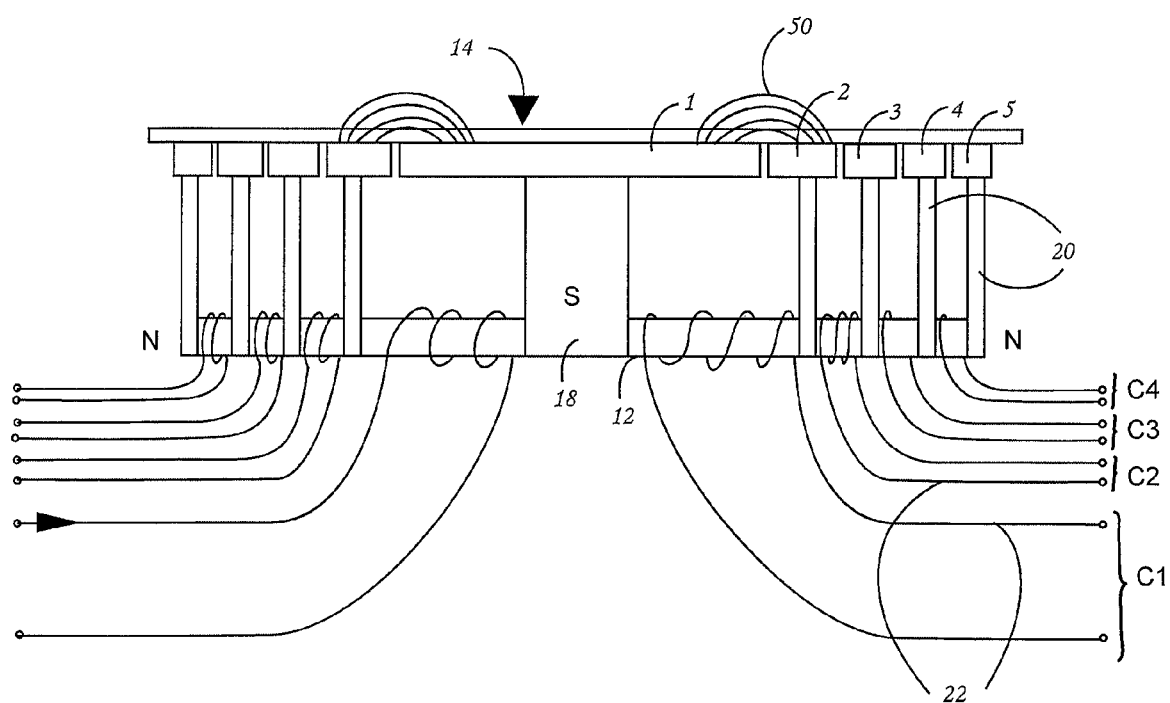
FIG. 8 is a cross sectional side view of the magnetic structure, illustrating a plurality of magnetic field lines generated by coil set 1 after the transition from coil set 2.
Figure 9:
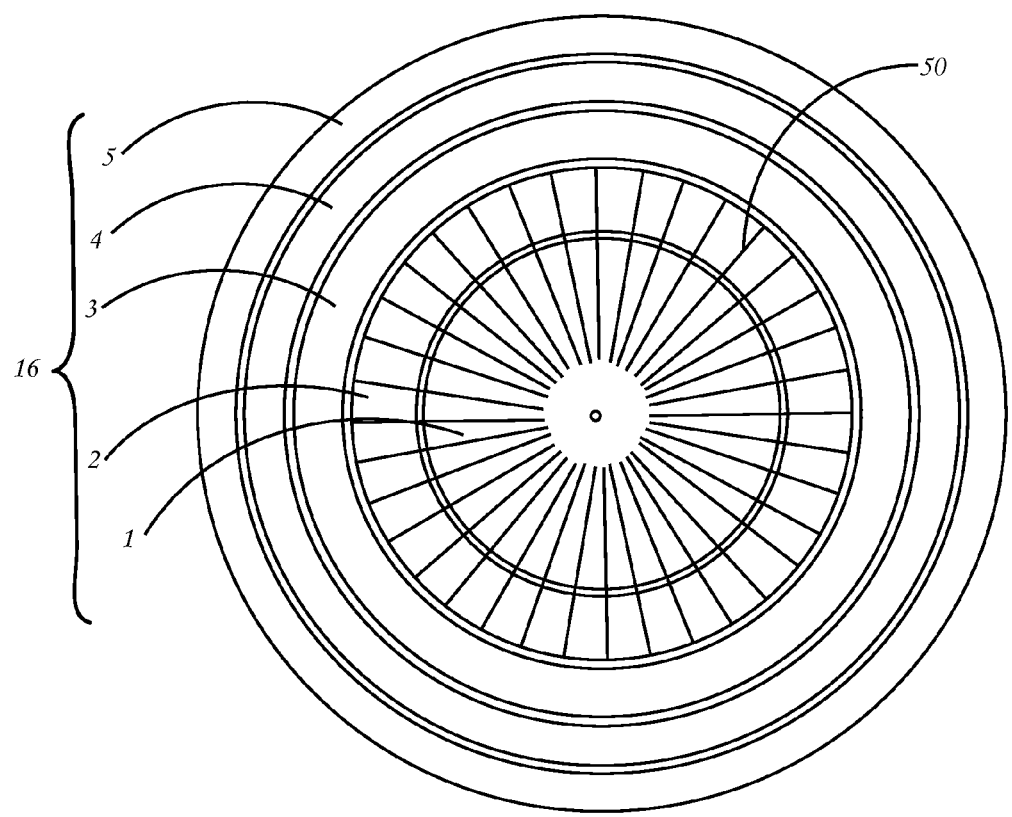
FIG. 9 is a bottom plan view of the magnetic structure, illustrating a plurality of magnetic field lines when coil set 1 is energized and coil set 2 is reverse biased.

FIGS. 8 and 9 illustrate a plurality of magnetic field lines 50 generated above the target 13 when coil set 1 is energized and coil set 2 is reverse biased. The plurality of magnetic field lines 50 are bridged across pole rings 1 and 2. The pole rings area relationship allows for a uniform magnetic flux density similar in strength from coil to coil. The magnetic field strength formed above the target 13 when coil set 2 is energized, during the transition from coil set 2 to coil set 1 and when coil set 1 is energized are all identical in strength. This uniform field is important in that it allows transitions without variations in a plasma density.

The plurality of electromagnetic coils 22 is phased in sequence to move the flux lines across the target surface 14. This phasing is a controlled ramp up and ramp down of sequential coils 22. During the ramp up and down, reverse windings 72 are also ramped up and down to contain the field between coils 22. The flux can be progressively moved from ID to OD and back or held in any position. The rate of motion is controllable as is the total flux strength. The coil set 1 is energized which at the same time applies a proportioned reverse magnetic current or bias to coil set 2. After the time duration selected by an operator (not shown), coil set 2 is ramped in current in a linear fashion. While coil set 2 is being energized, coil set 1 is ramping down in current along with the proportion reverse bias applied to coil set 2. Coil set 2 ramps up to the maximum selected current while coil set 1 ramps down in a corresponding manner. While coil set 2 is ramping up in current, coil set 1 and coil set 3 are receiving a proportioned amount of reverse bias. Similarly coil set 3 begins to ramp up in current as coil set 2 ramps down. As coil set 2 ramps down the proportioned reverse bias at coil set 1 and coil set 3 ramps down as well. While coil set 3 ramps up a proportioned reverse bias is applied to coil set 2 and coil set 4. Coil set 4 ramps up in current with a proportioned reverse bias to coil set 3. As coil set 4 ramps to maximum current, coil set 3 ramps down. With coil set 3, the reverse bias applied proportionally to coil set 2 and coil set 4 is ramped down. The process repeats in reverse back to coil sets 3, 2, 1, then back to coils sets 2, 3, 4 etc.

The speed or frequency of the ramping up and down from coil set to coil set is controlled by frequency rate or is manually fixable to any radius along the coil set transitions. Also, the inner and outer diameters can be set for the end points of coil phasing. The coil current is settable or controllable by means of a feedback network. By correct sizing of the plurality of magnetic pole piece structures 12 and the plurality of pole rings as well as the controlled phasing of coil sets and reverse bias, the plasma density can be swept across the target surface 14. The transitions from one diameter plasma to another may be controlled by the design of the source magnetic structure 10 maintaining a constant plasma density. The plasma and erosion cause ejection of higher angle particles 100 allowing higher levels of deposition uniformity and greater target 13 area utilization.

Figure 10:
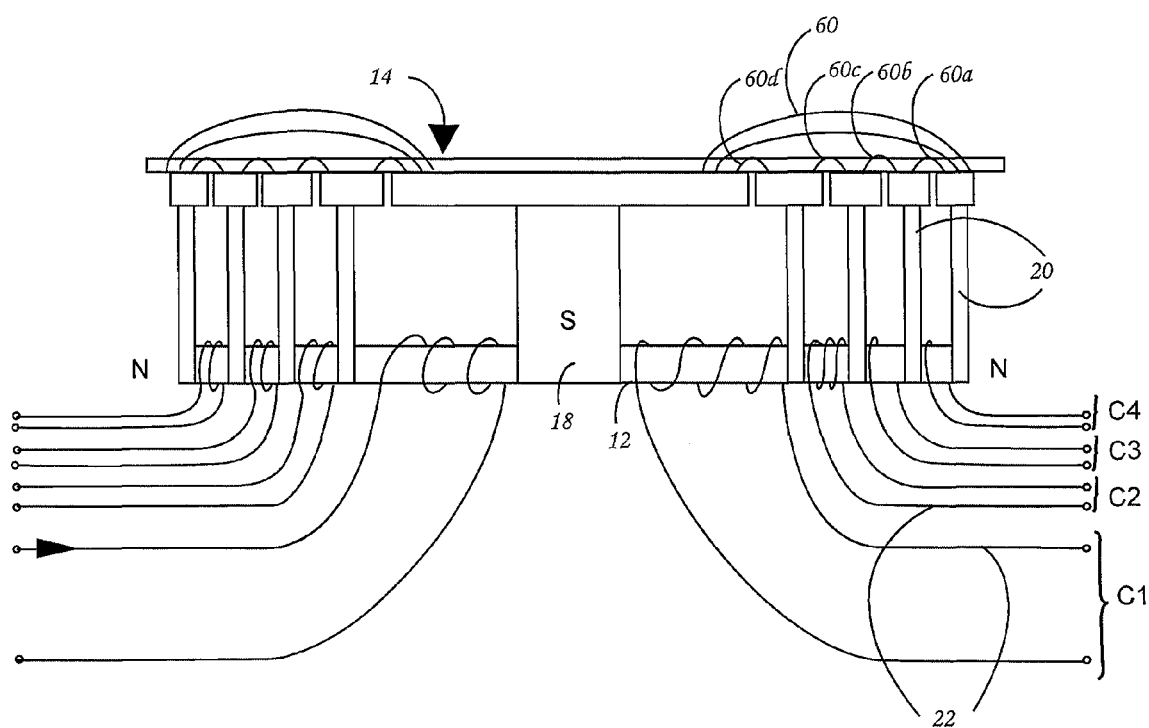
FIG. 10 is a cross sectional side view of the magnetic structure, illustrating a plurality of magnetic field lines generated above target when coil sets 1, 2, 3 and 4 are energized.
Figure 11:
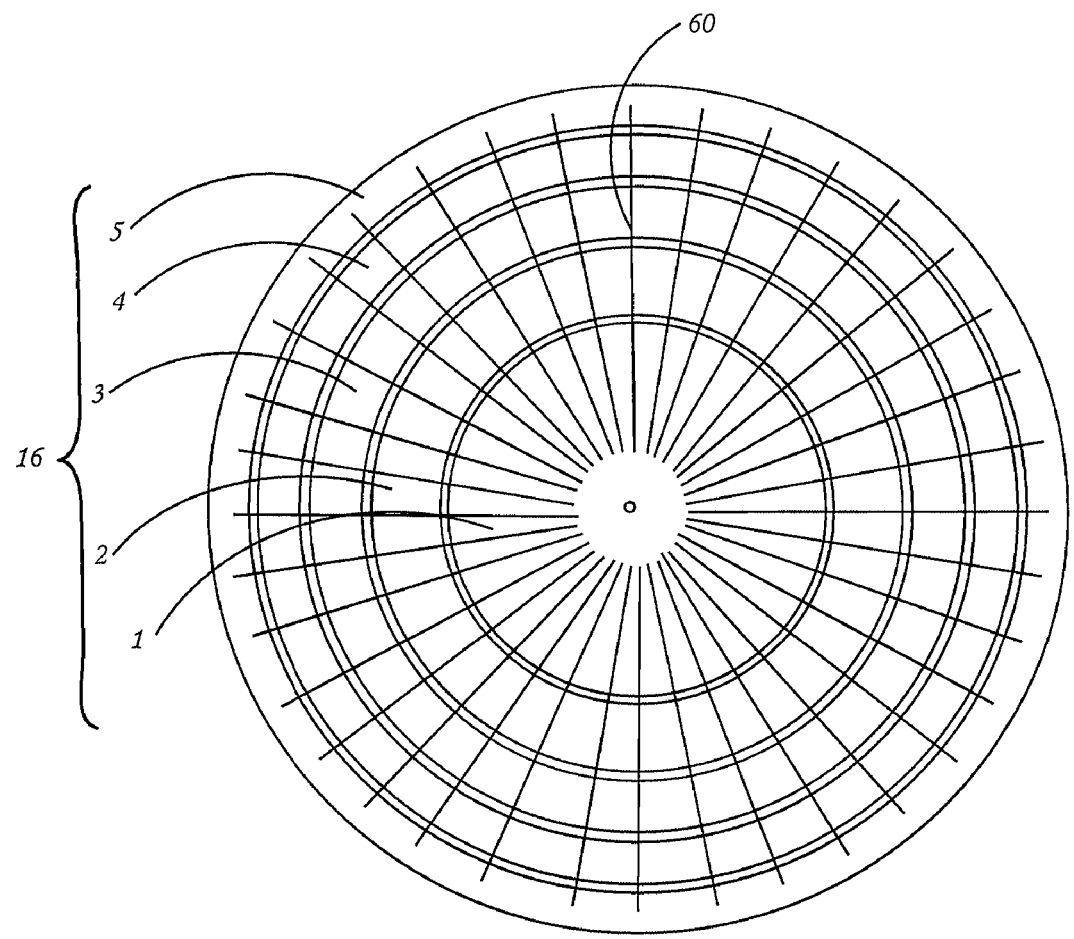
FIG. 11 is a bottom plan view of the magnetic structure, illustrating a plurality of magnetic field lines.

FIGS. 10 and 11 illustrate a plurality of magnetic field lines 60 generated above the target 13 when coil sets 1, 2, 3 and 4 are energized. The plurality of magnetic field lines 60 includes components 60*a*-60*d* and is uniform and balanced magnetic field incident to target surface 14. The addition of an overlapping or summed coil current signal will cause a component of high angle ejections to be combined with the normal lower angle ejections. Control of the amplitude and frequency allows the correct combination of high to low angle ejected particles. This added or summed current could be a phased current where the phasing may be from ID to OD to ID.

Figure 12:
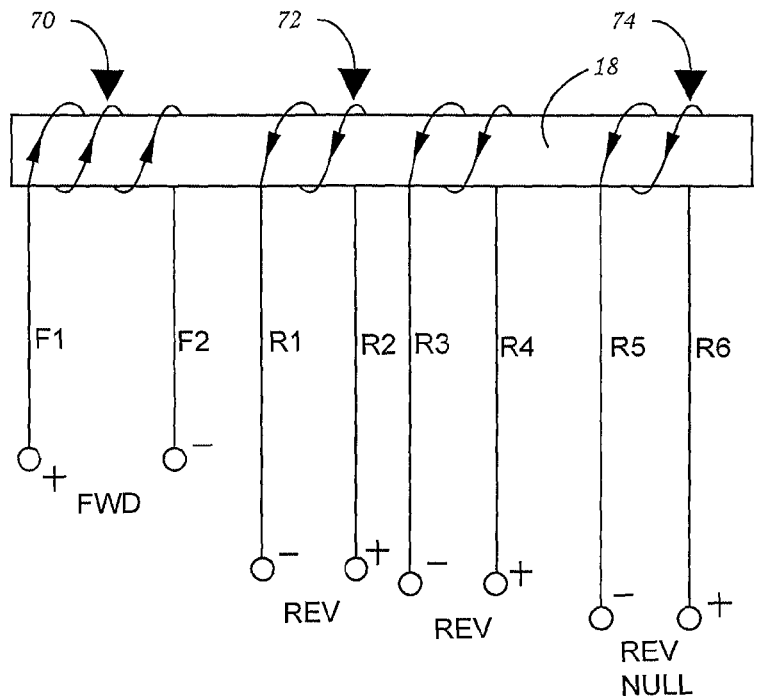
FIG. 12 is a diagram illustrating the relationship between forward, reverse and reverse null windings.
Figure 12:
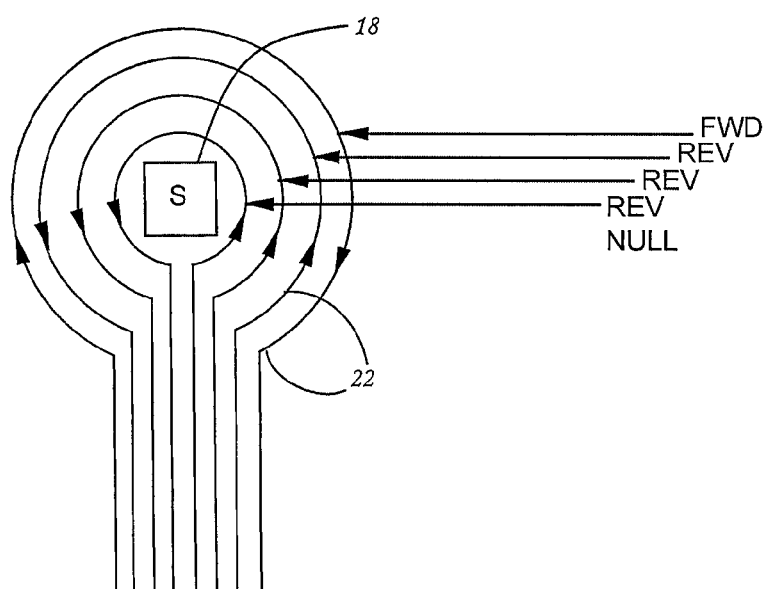

FIG. 12 illustrates the relationship between forward, reverse and reverse null windings 70, 72 and 74. There are 150 turns for forward magnetic field generation and 68 turns for reverse field generation and 7 turns for reverse field null generation. The exact number of windings would vary depending on voltage and current requirements. Each coil 1-4 would have forward and reverse windings 70 and 72. The forward windings 70 are to generate the main magnetic field. The reverse windings 72 are used to confine the field of the neighbor magnetic field. The reverse null winding 74 is used to null fringing fields from outer rings. The windings 70, 72 and 74 are wired in a way that allows for reverse biasing of neighbor rings when one ring is forward powered.

The forward biasing of all coil sets generate a broad flat magnetic field across a large area of the target 13. The plurality of magnetic pole piece structures 12 and plurality of pole rings 16 facilitates to tilt and/or shift the broad flat field thereby adjusting a plurality of angles of particle ejection from the target 13. The reverse biasing is applied to at least one outer coil associated to the plurality of magnetic concentric rings 16 facilitates shifting of area of erosion of the target 13. This movement and shaping achieved by the forward and reverse biasing is done across the central upright common core 18 without using any external means.

Figure 13:
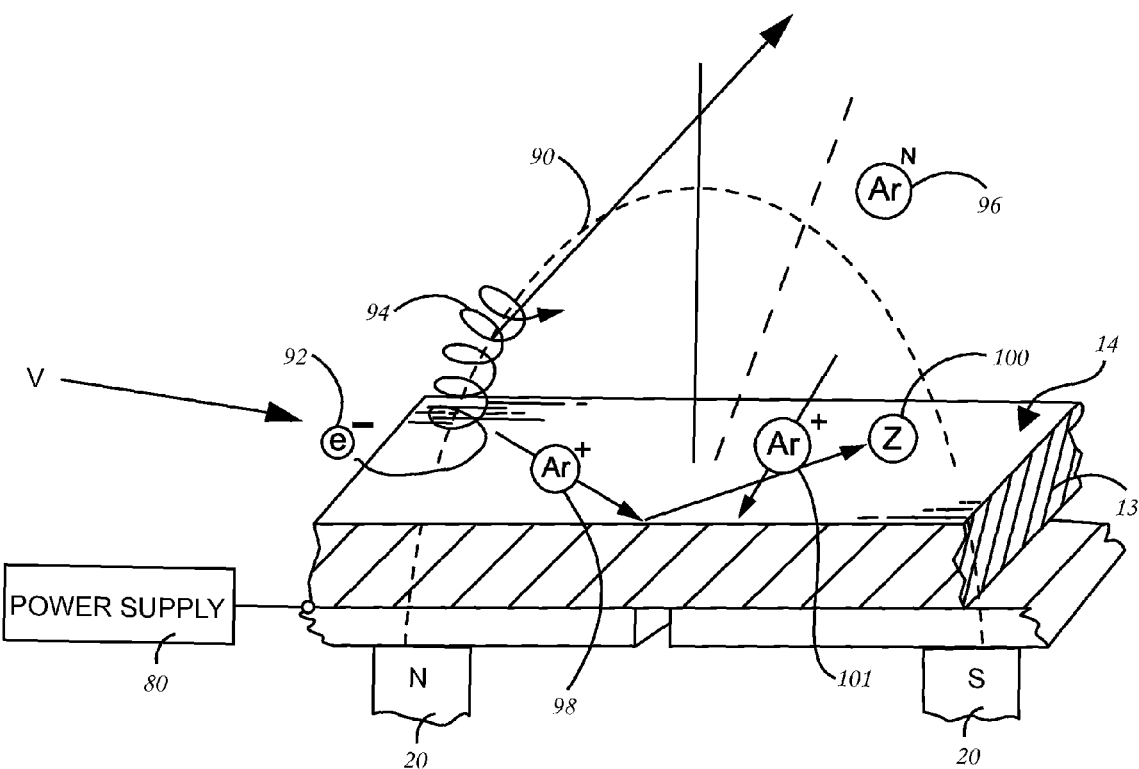
FIG. 13 is a sectional view of a magnetic structure, illustrating the interaction of a plurality of magnetic field lines, electrons, ions and ejected target particles.

FIG. 13 illustrates the interaction of the plurality of magnetic field lines 90, electrons 92, ions 98 and ejected particles "Z" 100. The target 13 may be charged to a required potential using a logic controlled power supply 80. When the magnetic field lines 90 are phased or moved across the target 13, the magnetic field lines 90 becomes an influence on the electrons 92 leaving the target surface 14. The motion of the magnetic field lines 90 will cause a spin state 94 in the electrons 92 around a portion of the vertical field line component. The spin electrons 92 collide with free gas, typically argon 96. This collision results in ionized argon molecules 98 created by the accelerated electrons 92, impacting the target 13 at a greater angle than normal and result in higher angle particle ejections. The control of the higher angle ejected particles 100 accomplishes higher levels of deposition uniformity and higher target 13 area utilization.

The logic controlled power supply 80 has at least one DC power source for generating sufficient level of voltage and/or current signal and a plurality of logic circuits that may be combined in various configurations to manipulate the magnetic field. The logic controlled power supply 80 powers the plurality of electromagnetic coils 22 in a desired manner to form plasma density, moves the plasma density, augments the electron spin states or acceleration, and/or preferentially directs the angles of deposition. The plurality of logic circuits may generate a fixed signal with a modulated signal superimposed thereon, said fixed signal being a summing current or summing voltage signal that drives said magnetic structure 10. The plurality of magnetic pole piece structures 12 wound with the plurality of electromagnetic coils 22 is sized for the voltage and/or current signals generated from the logic controlled power supply 80. The sets of plurality of electromagnetic coils 22 are wound in series to produce at least one magnetic circuit per ring pair.

The logic controlled power supply 80 generates a plurality of outputs controlled independently and in unison due to the following aspects. The ability to phase at least one set of coil's field lines into an adjacent set of coil's field lines maintain confined plasma density over the target surface 14. The ability to move the magnetic field lines across the target surface 14, manually or automatically, hold in one position along the radius, thus moves the plasma density at variable rates, amplitude and ramp velocities while, maintaining plasma impedance. The plurality of outputs has the ability to develop one continuous magnetic field over a series of plurality of magnetic pole piece structures 12 and the ability to alter the field lines along the annular radii of this field and the ability to bias this field at one pole or the other. The plurality of outputs also includes the ability of selecting a variable frequency and amplitude signal.

A phased operation may function in at least one of a plurality of operational modes like a phased sweep mode, a uni-plasma mode, a uni-plasma with phased acceleration mode, a uni-plasma with amplitude modulation mode, and a uni-plasma with rotational acceleration mode. Thus the plurality of phased operational modes control the movement of the ion trajectory and the rate of ejection of plurality of higher angle particles 100 ejected from the at least one target surface 14.

Figure 13A:
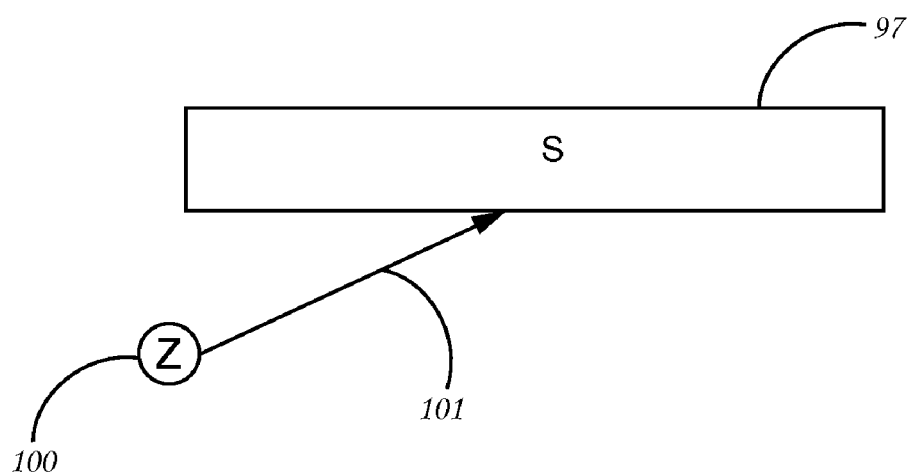
FIG. 13A represents a substrate surface being contacted by an ejected particle originating from a target surface of the invention shown in FIG. 13.

In phased operation, the time duration may be controlled for uniform erosion of the target material. Another attribute of this design is the effect on electron density and the corresponding ion sheath. This effect in turn allows control of ejected target particles 100. The radial motion of the magnetic field during the phasing action from coil set to coil set results in a spin state 94 of electron acceleration along a perpendicular portion of the plurality of magnetic field lines 90. This acceleration is in addition to the normal electron spin acceleration 92 along the parallel magnetic field lines 90. This spin state 94 induces a component to the ion sheath that adds additional higher angle ionized argon molecules 98 to be accelerated toward the target surface 14. The resulting higher angle ejected particles 100 are at a corresponding angle 101 less normal to the target surface 14. The benefit of the higher angle particle ejection is more conformal coverage of a substrate "S" surface 97 positioned in front of the target 13 (See FIG. 13A). By controlling the speed of the phasing the percentage of higher angle particle ejections can be similarly influenced. Thus with a percentage of higher angle ejected particles 100 at a controlled rate the conformal coating aspect can be precisely regulated.

In uni-plasma with amplitude modulation mode, the inventive device functions in a forward bias applied to at least one set of electromagnetic coils simultaneously that cause superimposition of a plurality of current signals generating a variable riding current. This superimposed current would control the amplitude and frequency. The variable riding current accelerates the plurality of electrons in both high and low angle field lines thereby providing a fine control over direction of the plurality of higher angle ejected particles 100 from the target surface 14. In this mode, the inventive device also functions with a phased pulse current riding in a circular manner in which at least one of plurality of magnetic pole piece structures 12 is pulsed in a rotational manner. This would cause localized randomization and acceleration which moves around the plasma density. This can be controlled in frequency and amplitude to derive desired deposition effects. This is desirable in the case of magnetic material target.

In uni-plasma with rotational acceleration mode, the inventive device operates with an arrangement having a South Pole positioned to at least one target ID and a North Pole positioned to at least one perimeter. This arrangement is helpful in a balanced design due to the induced current and magnetic field by the plasma density. This plasma current induces a magnetic field that compliments an inward South Pole magnetic field.

Figure 14:
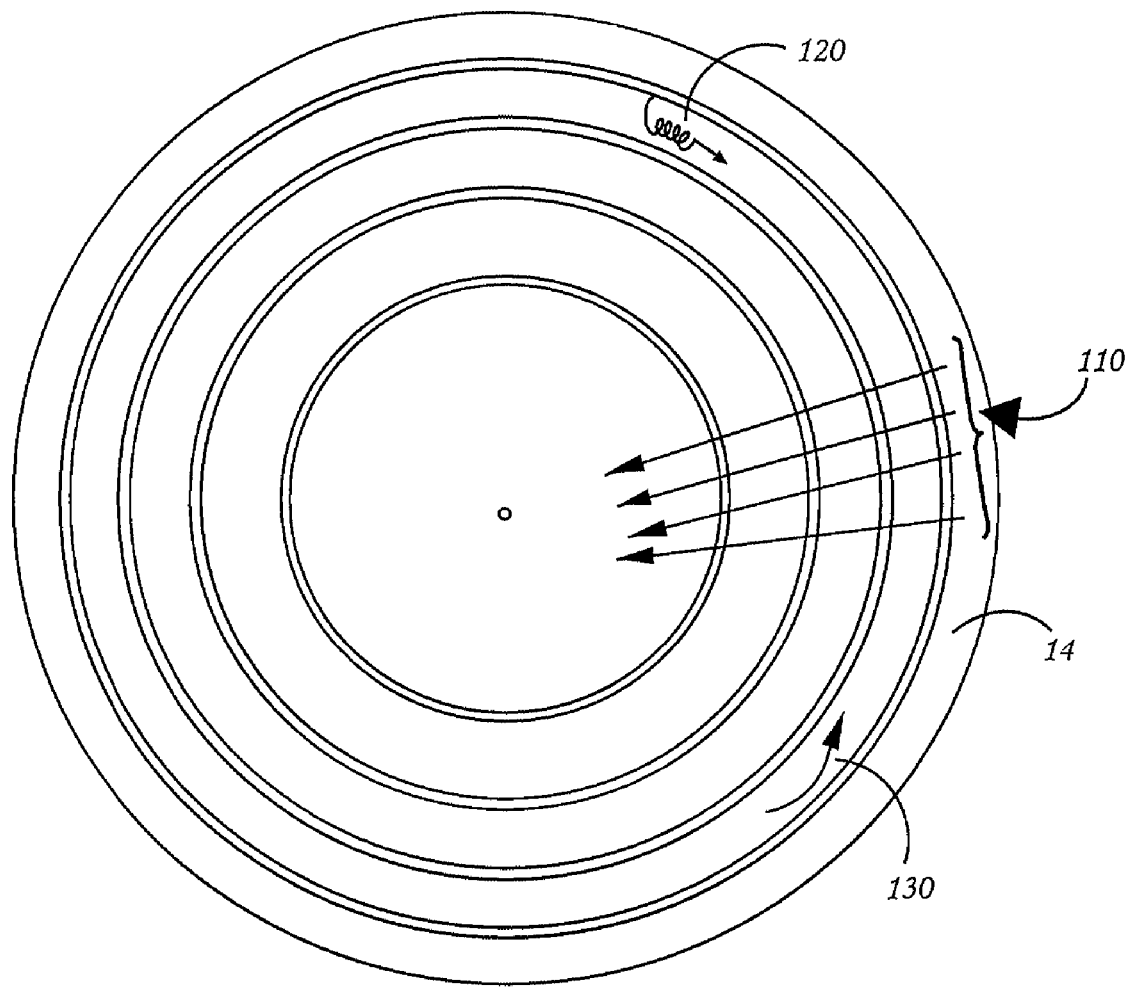
FIG. 14 is a diagram illustrating the rotation of plurality of magnetic field lines that controls the electron spin acceleration.

FIG. 14 illustrates the rotation of the plurality of magnetic field lines that control the electron spin acceleration. The direction of the plurality of magnetic field lines 110 in a manner that is concentric around a centerline perpendicular to the target 13 will cause added or reduced acceleration of electrons along the plurality of field lines. The electrons are accelerated not only in the parallel field lines but also in the vertical field lines. The result will be an augmentation or reduction in the ion generation and plasma density relative to rotational speed and rotational direction. The direction of electron drift 120 and plasma current 130 results effective utilization of target material mounted on at least one target 13 surface 14. The plasma current 130 is counter clockwise and this augments the north south magnetic field. For example, rotation of the magnetic structure 10 in a counter clockwise direction, when viewed from the target surface 14 will result in augmentation of the electron accelerations and a denser plasma as well as some level of higher angle particle ejections.

Figure 15:
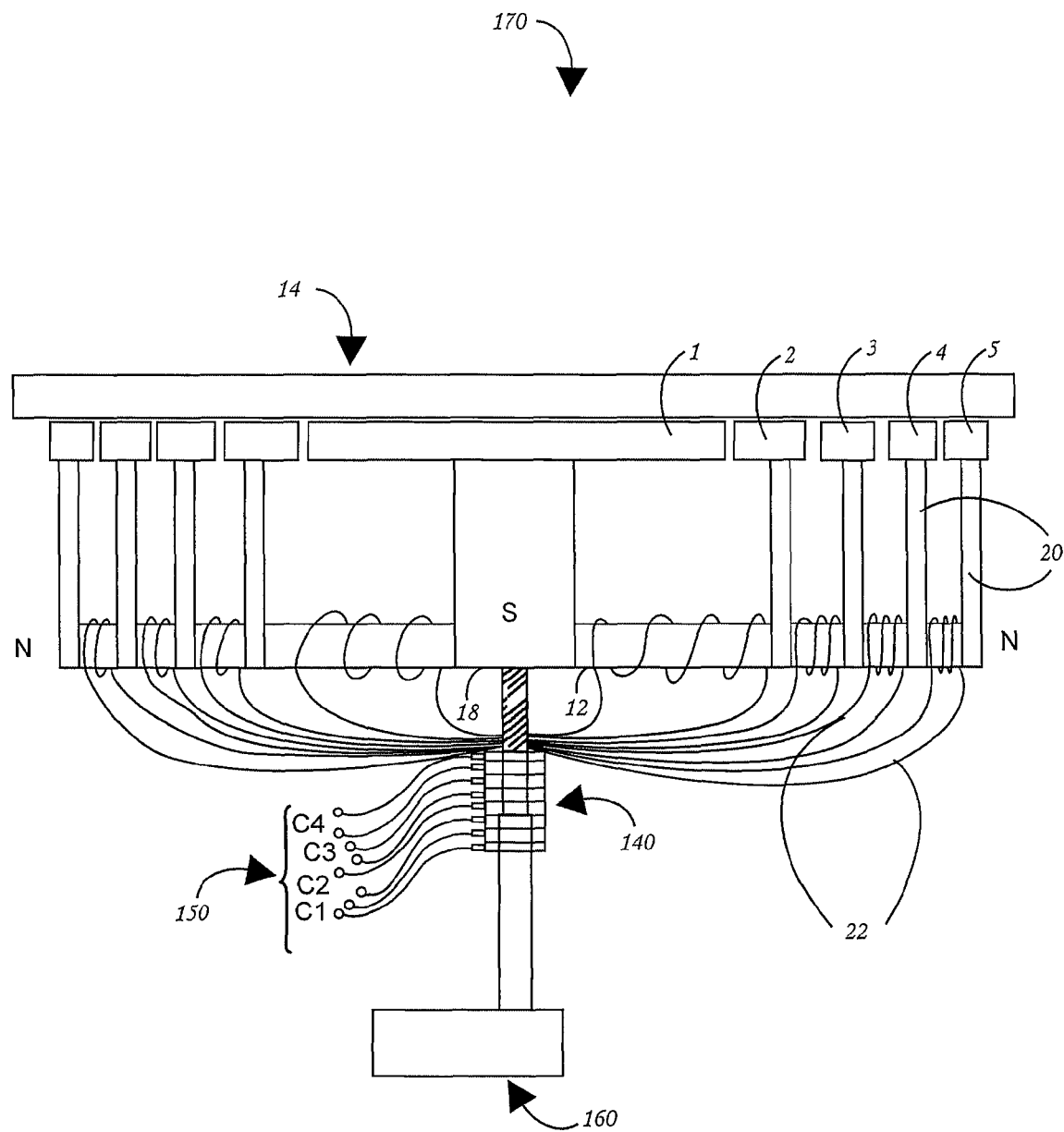
FIG. 15 is a cross sectional view of an alternate embodiment of the inventive device, illustrating rotation of the magnetic structure with the rotation of permanent magnets.

FIG. 15 illustrates an alternate embodiment of the inventive device that would be the rotation of the magnetic structure 170 on a central axis. The rotation velocity and direction would have tremendous influence on the plasma density and the higher angles of particles 100 ejected from the target 13. For example, the magnetic field will accelerate electrons when the field rotated in a counter clockwise direction as viewed from the target surface 14. The electrons in a magnetic structure 170 with a parallel component travel in a spiraling helix manner in a clockwise direction. This is due to the right hand rule applied as the electrons encounter the field lines above the target 13 with the South Pole at the inner diameter. The rotation of the magnetic field in a direction toward the spiraling electrons achieves added acceleration. The regulation of the rotational velocity and direction may influence the plasma density as well as particle angle as ejected from the target surface 14. This method of rotation is achieved by the rotation of a permanent magnet arrangement with rotational drive motor 160 or through electromagnets in conjunction with a set of electrical brush contacts 140. A set of coils 150 also provided to drive power to the arrangement.

Figure 16:
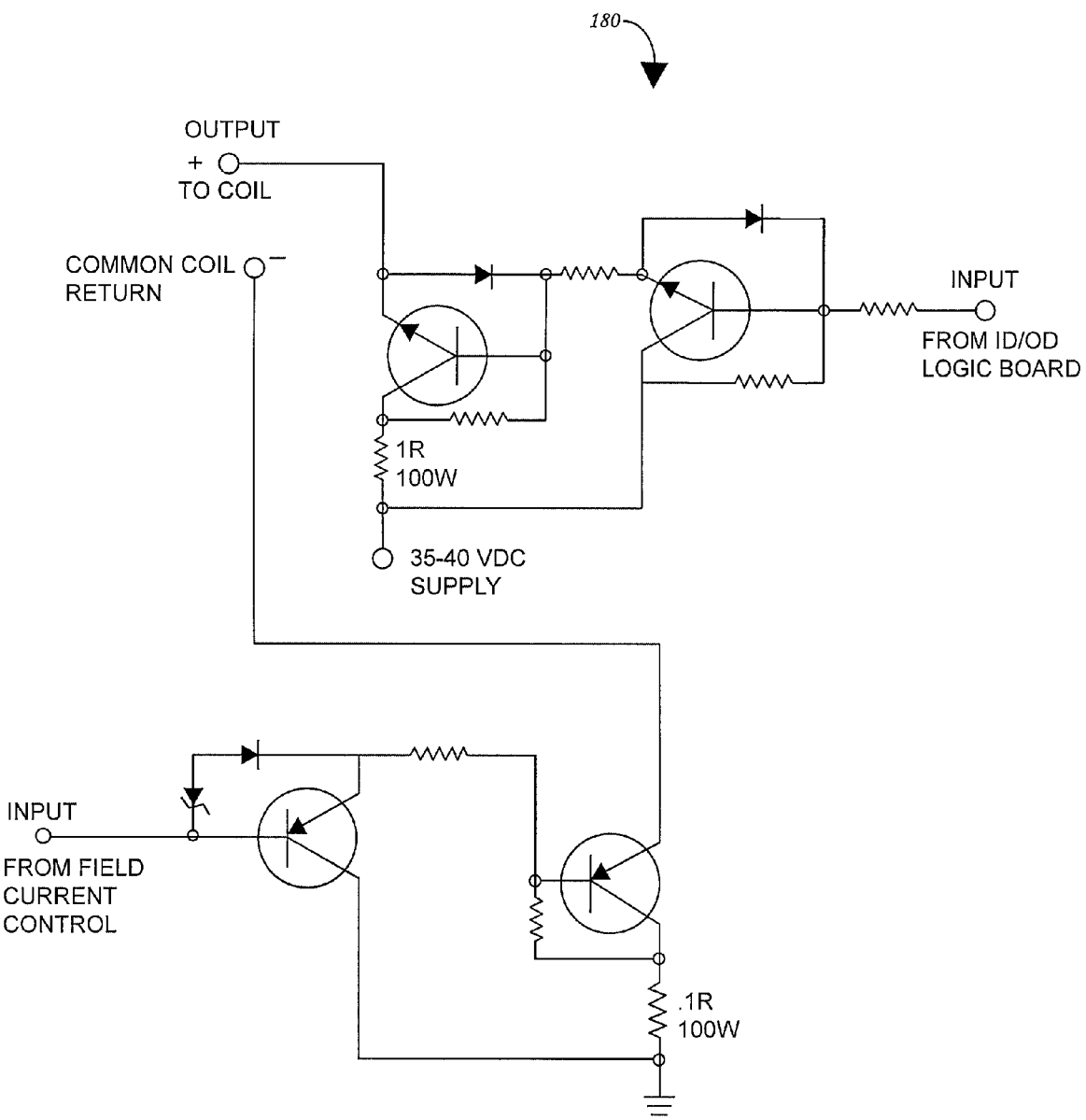
FIG. 16 is a circuit for output current regulation associated with the logic controlled power supply of the present invention.

FIG. 16 illustrates a circuit 180 for output current regulation associated with a logic controlled power supply 80 that drives the device designed for controlling sputter coating deposition. The logic controlled power supply 80 manages the current flowing through the plurality of electromagnetic coils 22. The level of control of the logic controlled power supply 80 may be achieved through hardwired analog logic or through the use of digital logic and digital to analog converters. The output current regulation is through power transistors, one circuit for each coil set. The output current transistors are voltage controlled with current compensation. The returning current is through another set of power transistors with current compensation feedback. This input or output regulation allows for individual voltage controlled current outputs as well as a common current control for all.

Figure 17:
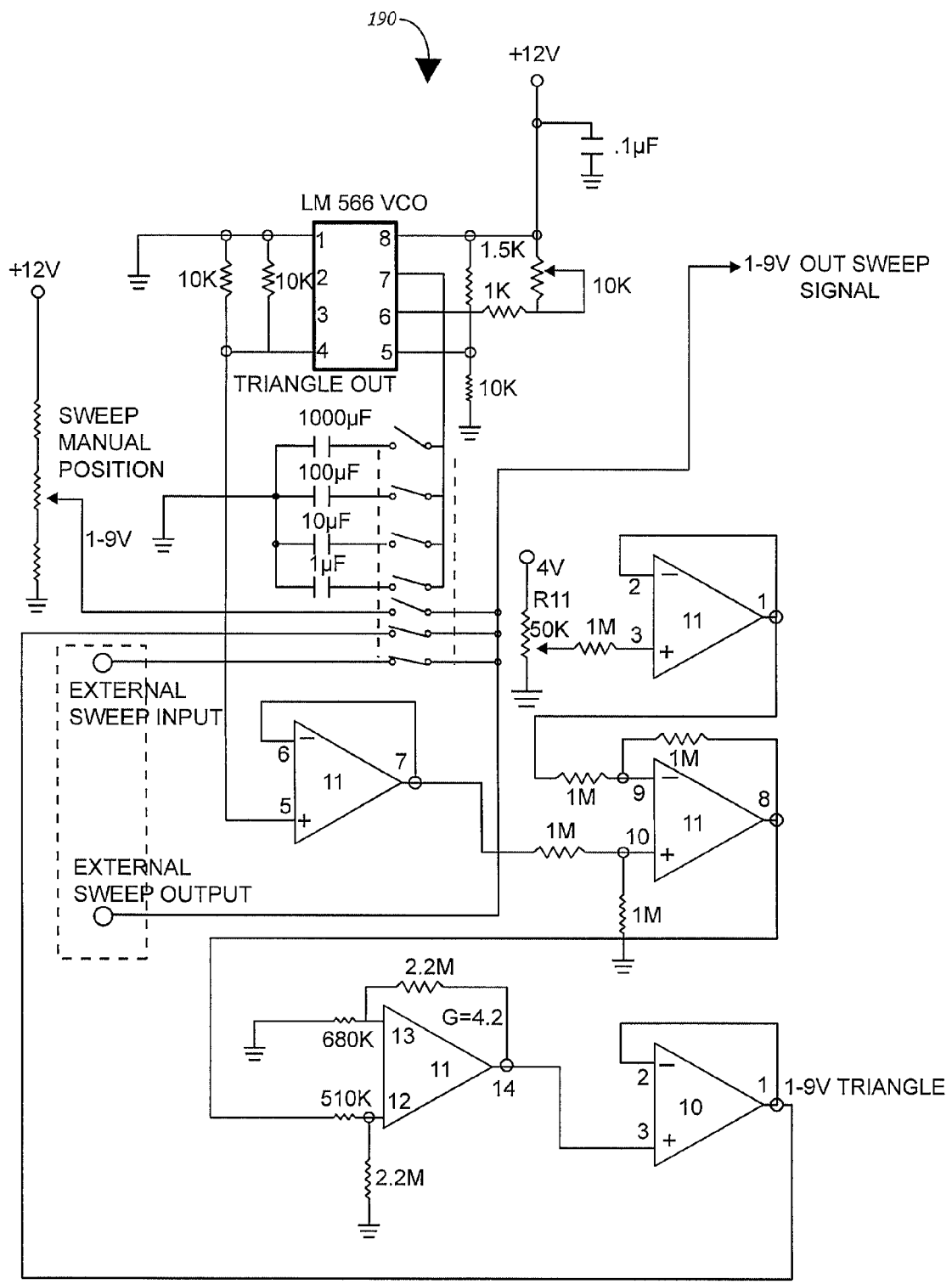
FIG. 17 is a phase oscillator circuit with end point integration of the present invention.

FIG. 17 illustrates a phase oscillator circuit 190 with end point integration. The circuit 190 consists of a frequency generator designed to produce a triangle wave output. The frequency is controlled by a manual capacitance selector and a variable resistor permitting a manual fixed position as well. The triangle wave is amplified to a 1-9 volt signal.

Figure 18:
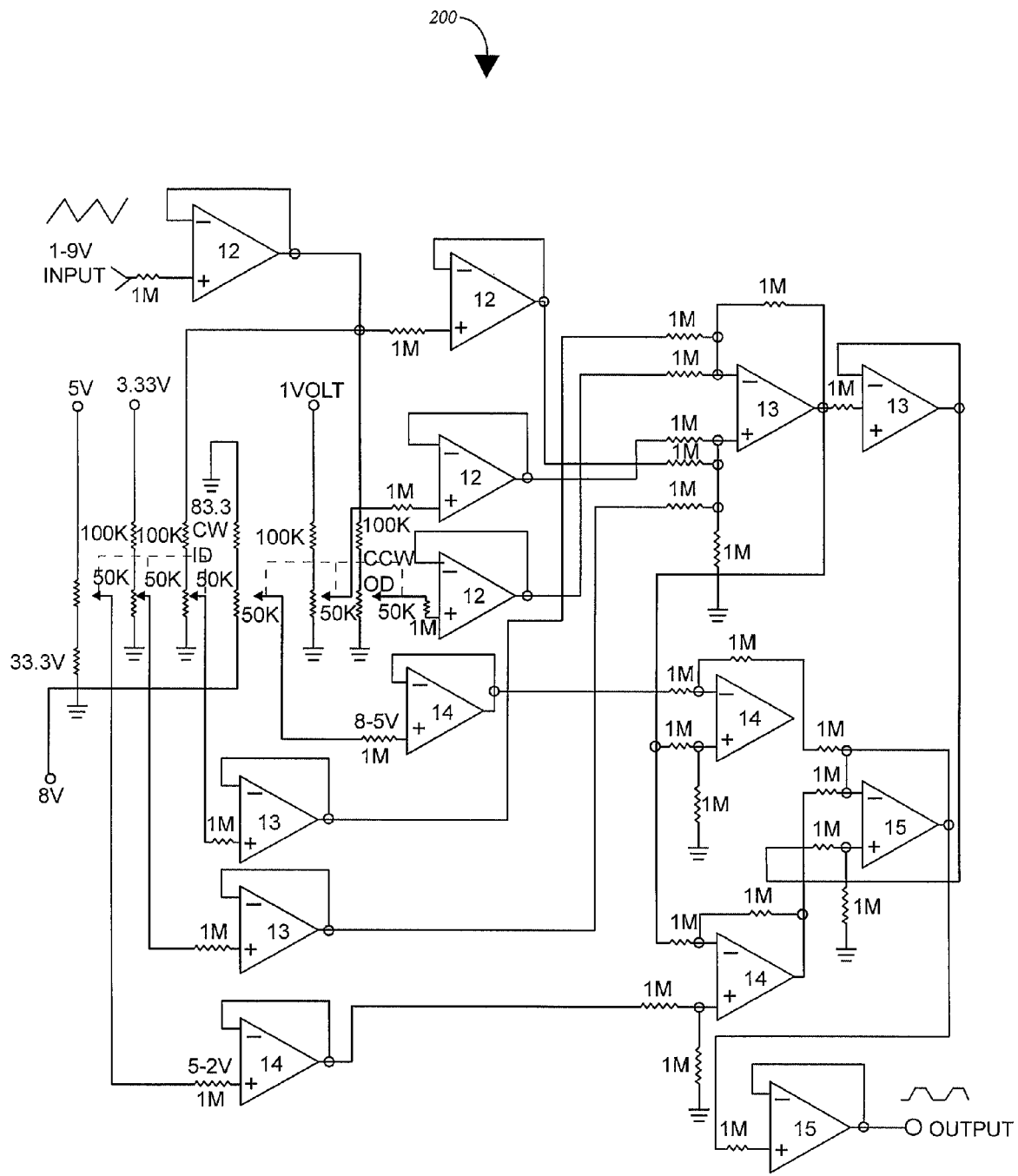
FIG. 18 is a phased sweep logic ID/OD control circuit with end point integration of the present invention.

FIG. 18 illustrates a phased sweep logic ID/OD control circuit 200 with end point integration. The output of the oscillator circuit 190 can be sent directly to the phase generation amplifiers or sent through an ID/OD control circuit 200. This circuit 200 can be used to control the innermost and outermost diameters the plasma will travel. The end point integration allows the additional time at each end point to compensate for the two passes across the median points taken for every pass of an end point.

Figure 19:
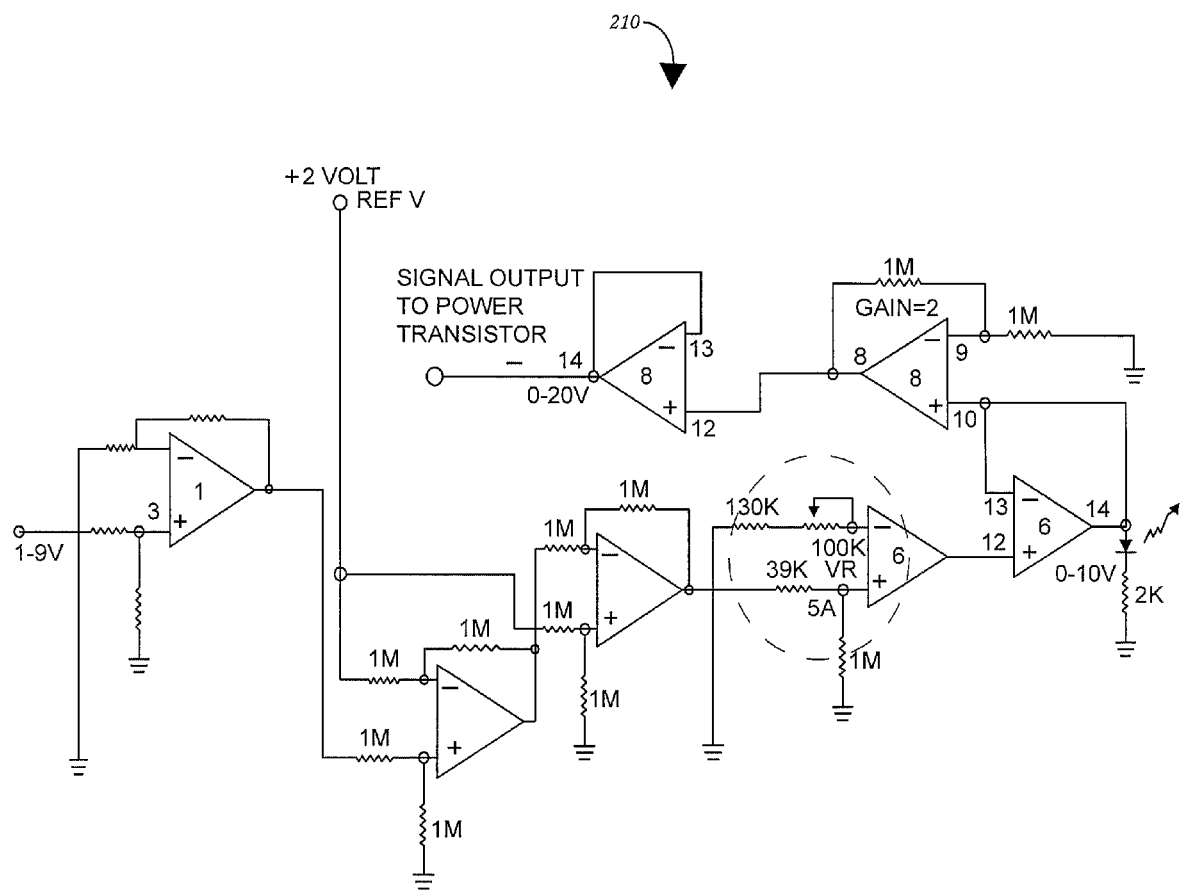
FIG. 19 is a circuit illustrating a series of operational amplifiers designed to respond to selected voltage ranges.

FIG. 19 illustrates a circuit 210 with a series of operational amplifiers designed to respond to selected voltage ranges.

Figure 20:
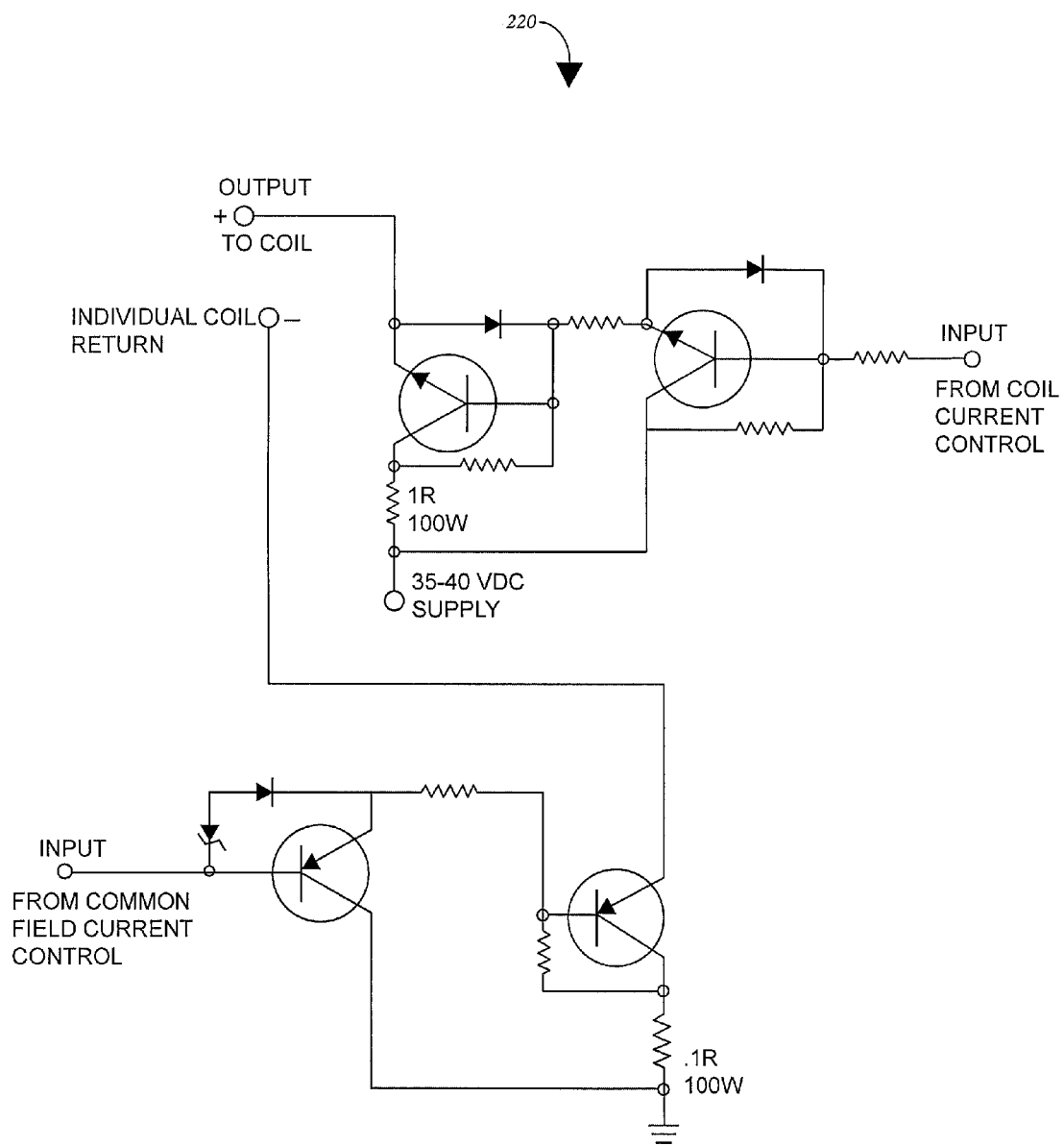
FIG. 20 is a circuit illustrating a uni-plasma operation wherein the output stages are utilized along with the current return power transistors.

FIG. 20 is a circuit 220 illustrating a uni-plasma operation wherein the output stages are utilized along with the current return power transistors. The current for each coil set is adjusted through the output stages and the return current transistors are common field control.

Figure 21:
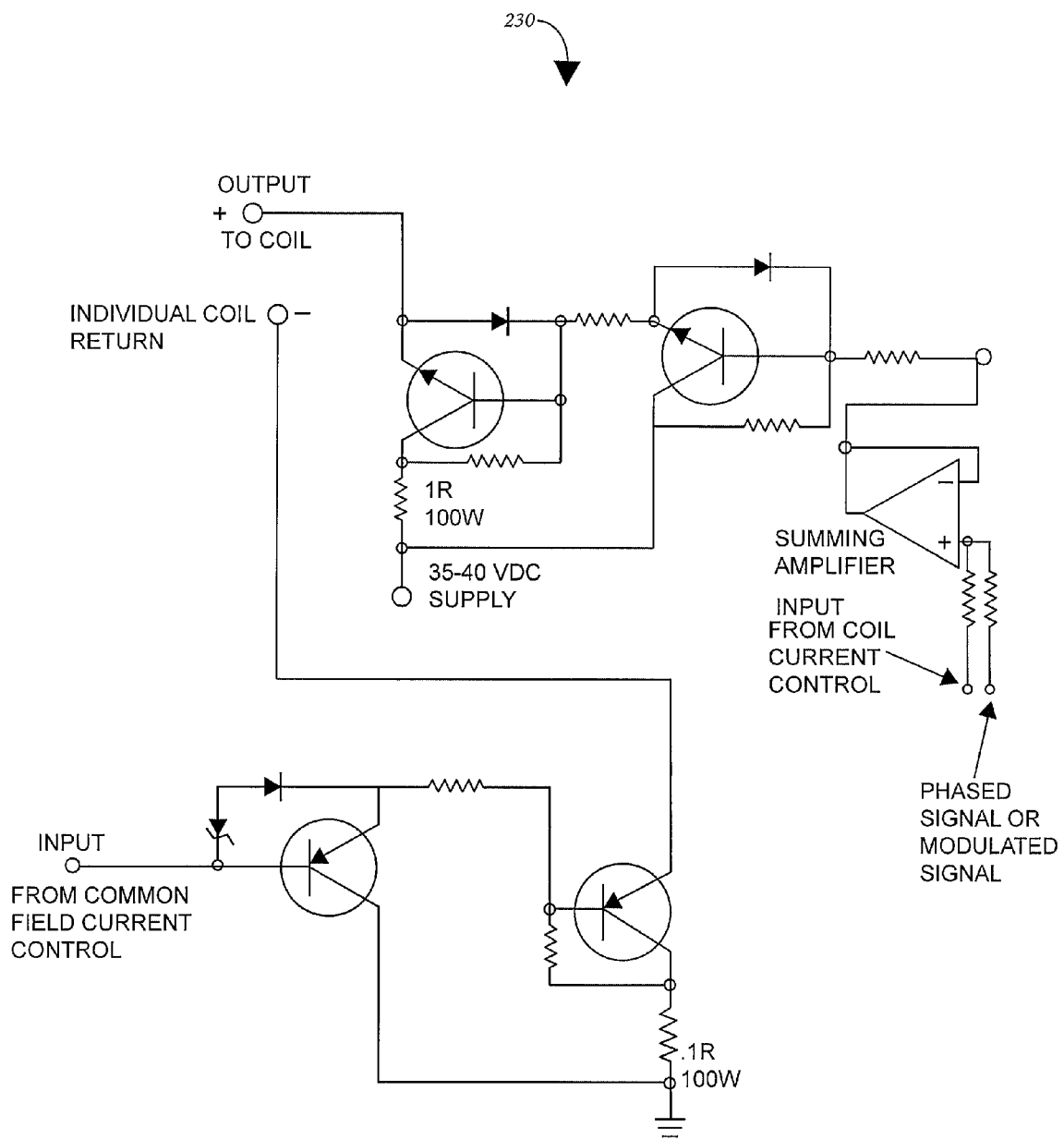
FIG. 21 is a circuit illustrating a uni-plasma operation in combination with either phased sweep current or modulated current riding on a carrier current.

FIG. 21 is a circuit 230 illustrating a uni-plasma operation in combination with either phased sweep current or modulated current riding on at least one carrier current.

Figure 22:
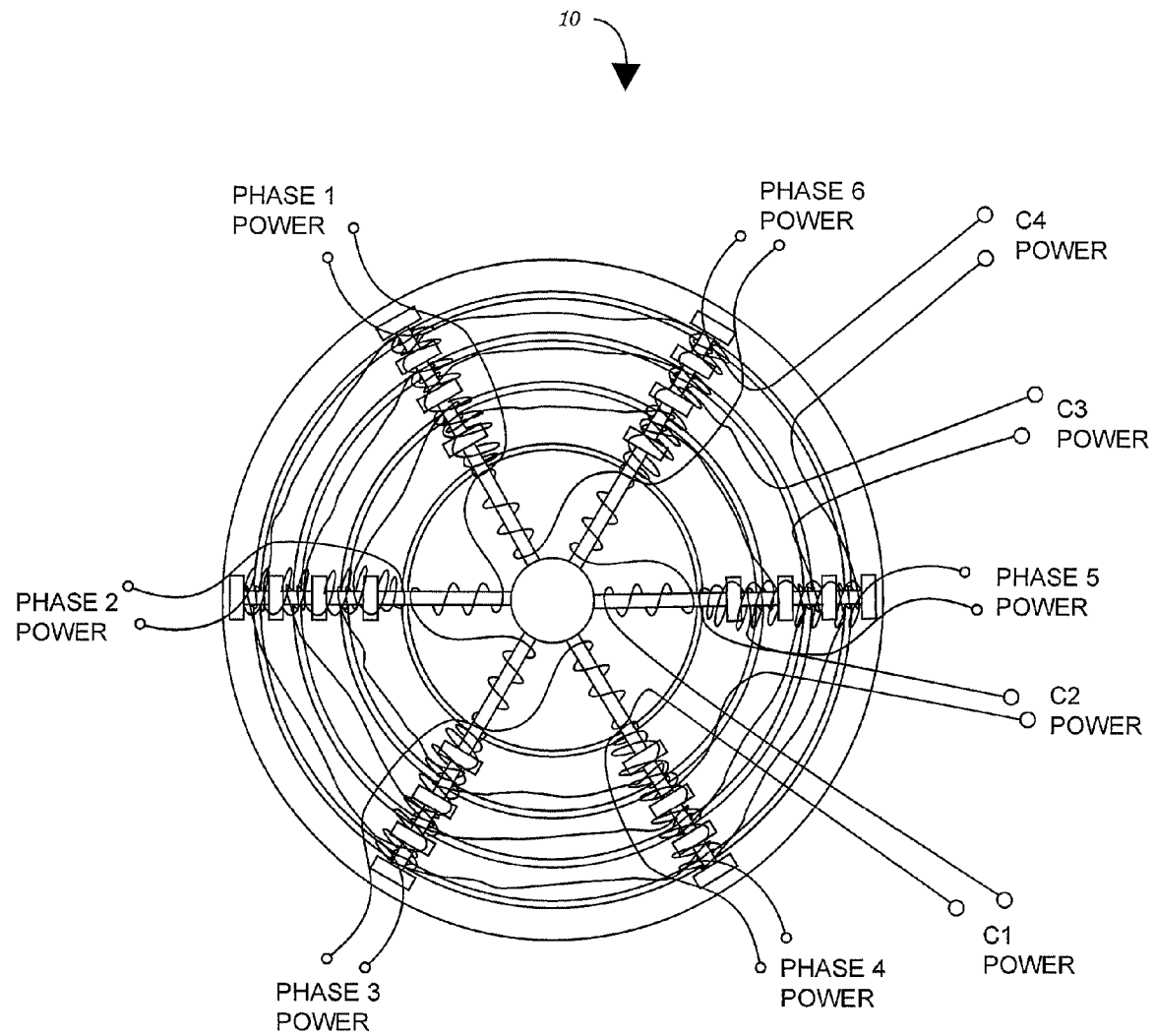
FIG. 22 is a top plan view of the magnetic structure, illustrating the phased rotation of the device of FIG. 1.

FIG. 22 illustrates a phased rotation of the magnetic structure 10 associated with the device designed for controlling sputter coating deposition. This may require an additional output and return power transistor supply for the phased current. The phased output may be used to drive additional windings in each coil set. The number of phases may be determined by the number of plurality of magnetic pole piece structures 12. The logic circuit as described to generate the four phases or a digital circuit would be used to generate the required number of phases. The additional coils and drivers are sequentially phased in a clockwise or counter clockwise direction. The rotational phase coils are wound forward relative to the main field coils.

The logic controlled power supply 80 may apply a forward powering to at least one of the set of electromagnetic coils that facilitates a balanced parallel electromagnetic field that resulting in a large area flux and a broad ion sheath. Each ring set's coils can be independently adjusted to create the desired magnetic field. The logic controlled power supply 80 may also apply a reverse powering to at least one of the set of electromagnetic coils, typically the outermost ring coil sets. This focuses the magnetic flux generated above the plurality of magnetic concentric rings 16. A magnetic field can be created over one ring pair. Adjacent ring coil sets can be reverse powered to further confine the field. This field can be stationary or moved to any position along the ring diameters. The field may be moved in a controlled manner from ID to OD while maintaining the required flux density. The movement speed can be controlled as well as the field strength. A broad flat magnetic field can have the moving field superimposed on it. This field can be moving to ID to OD to ID or in a circular fashion. Thus the reverse powering may facilitate shifting of at least one erosion area of the at least one substrate (not shown).

Figure 23:
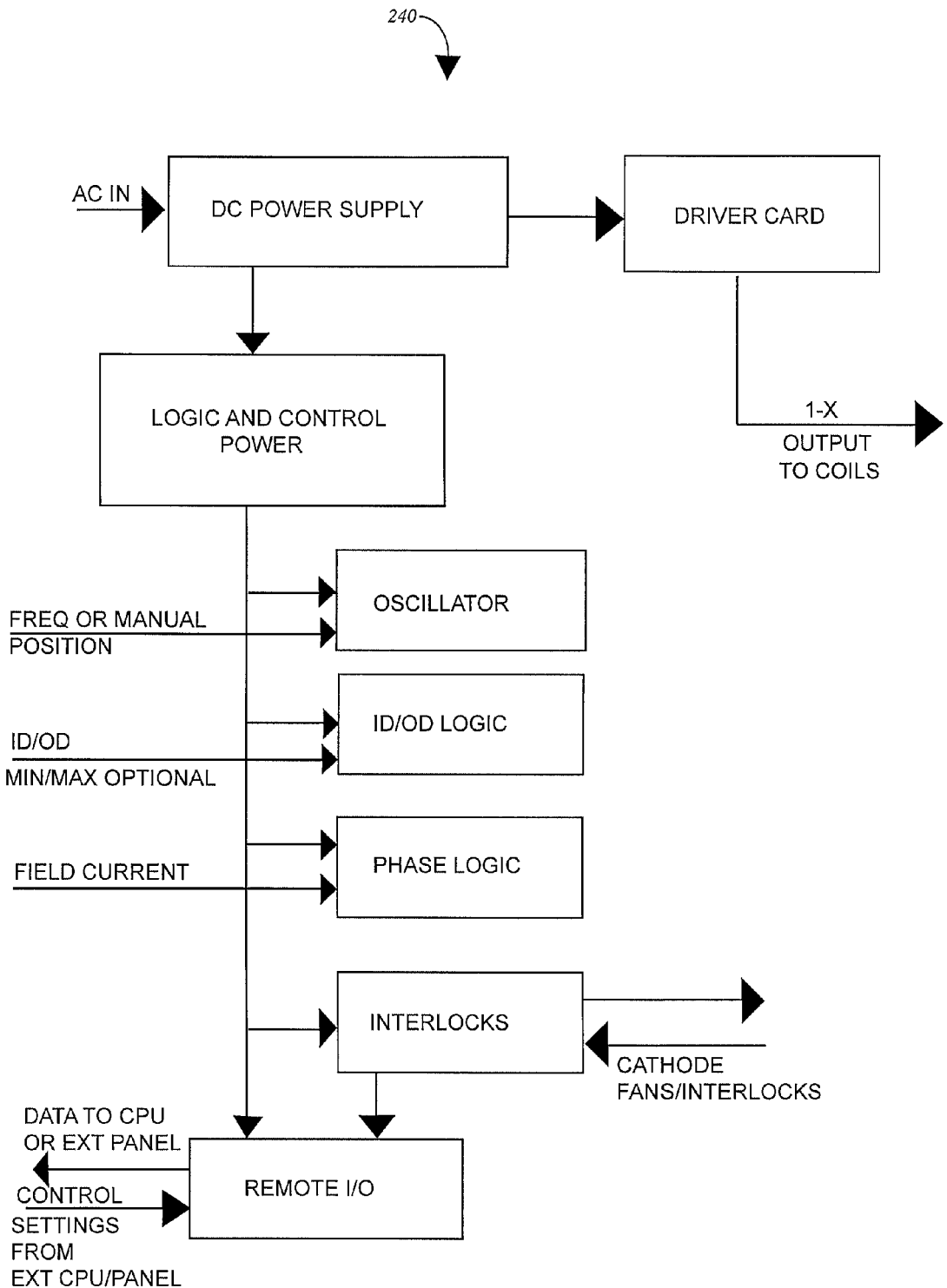
FIG. 23 is a block diagram of a circuitry implemented to generate output to electromagnetic coils functioning in a phased sweep operational mode.
Figure 24:
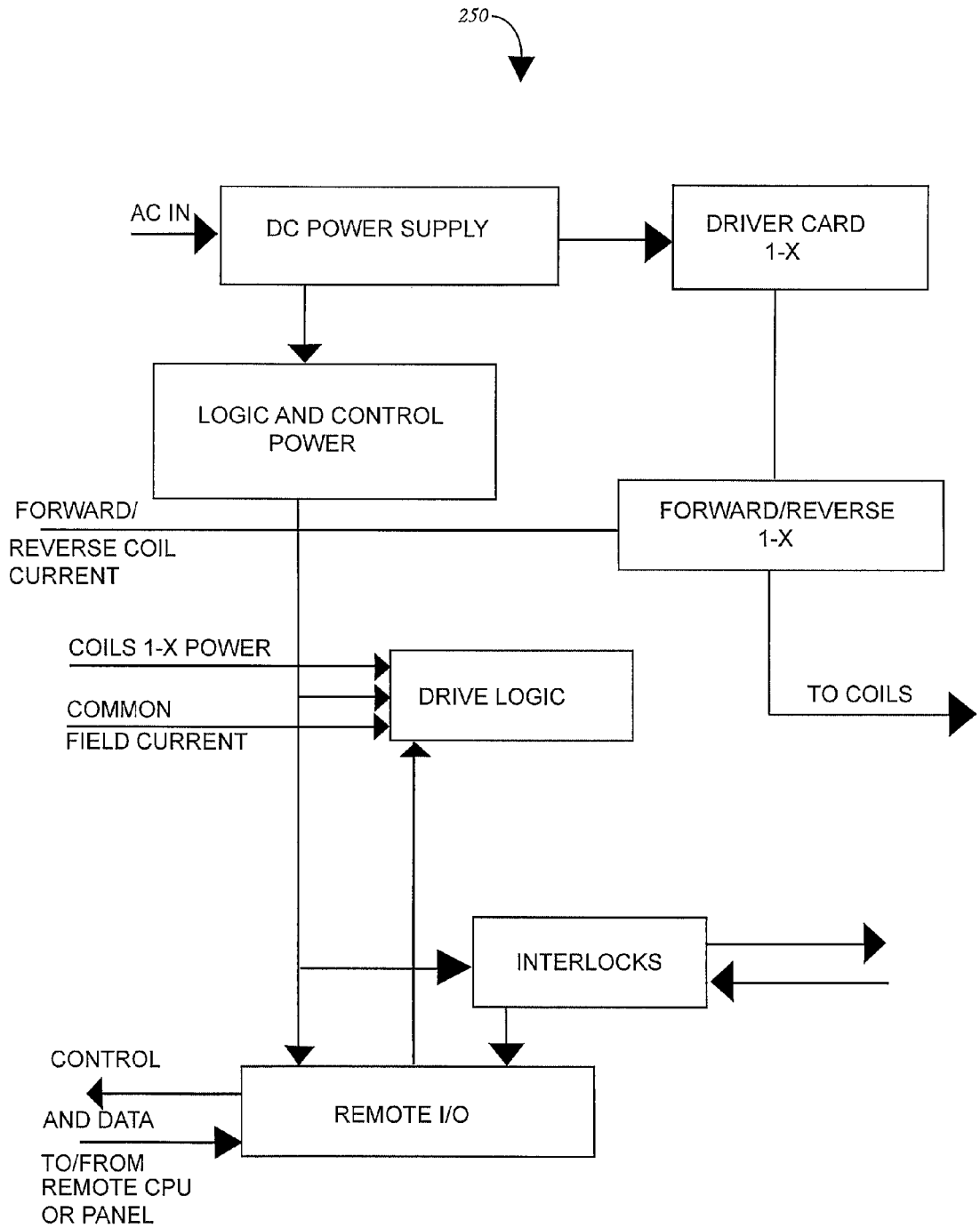
FIG. 24 is a block diagram of a circuitry implemented to generate output to electromagnetic coils functioning in a uni-plasma operational mode.

FIGS. 23 and 24 illustrate block diagrams 240, 250 of circuitries implemented to generate output to the plurality of electromagnetic coils 22 functioning in a phased sweep operational mode and a uni-plasma operational mode respectively.

Figure 25:
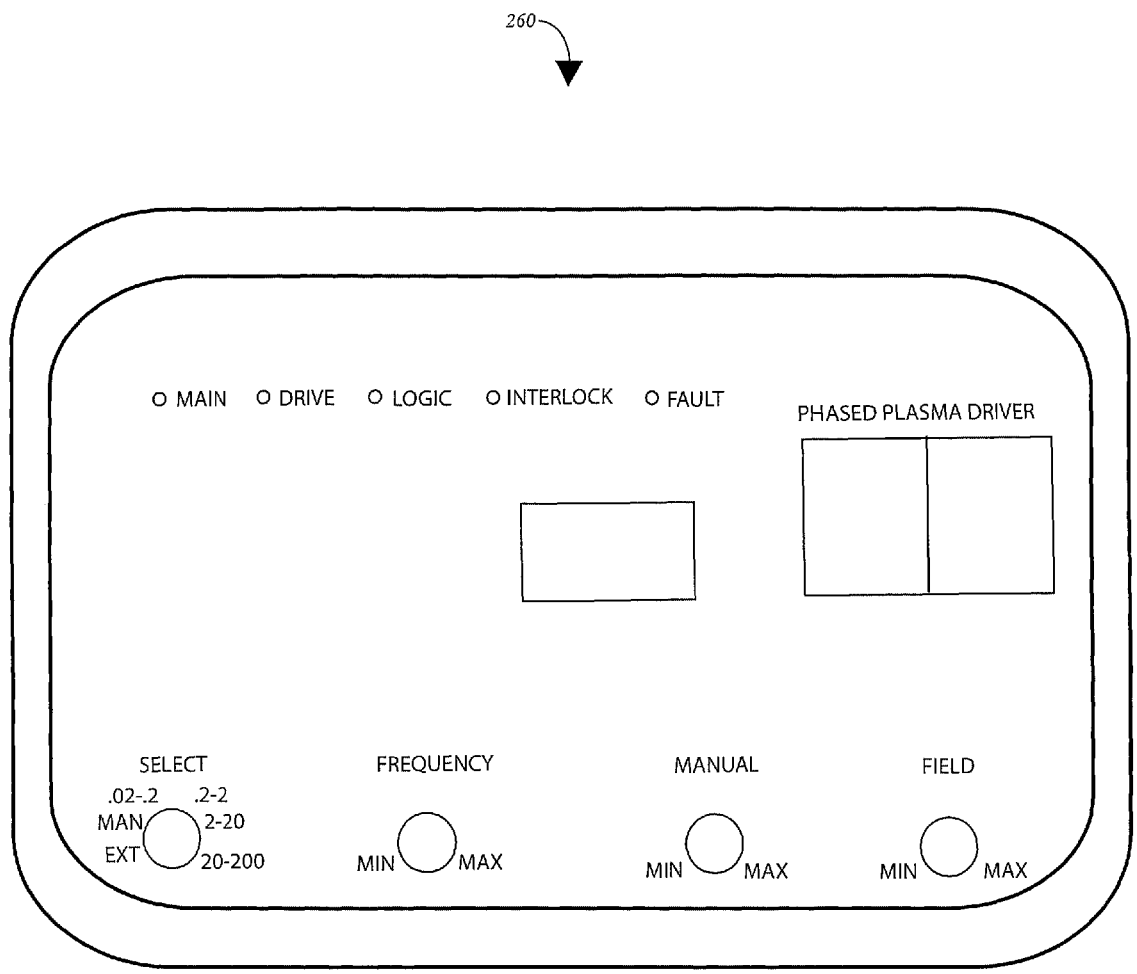
FIG. 25 is a front view of a phased plasma driver unit associated with the logic controlled power supply of the present invention.
Figure 26:
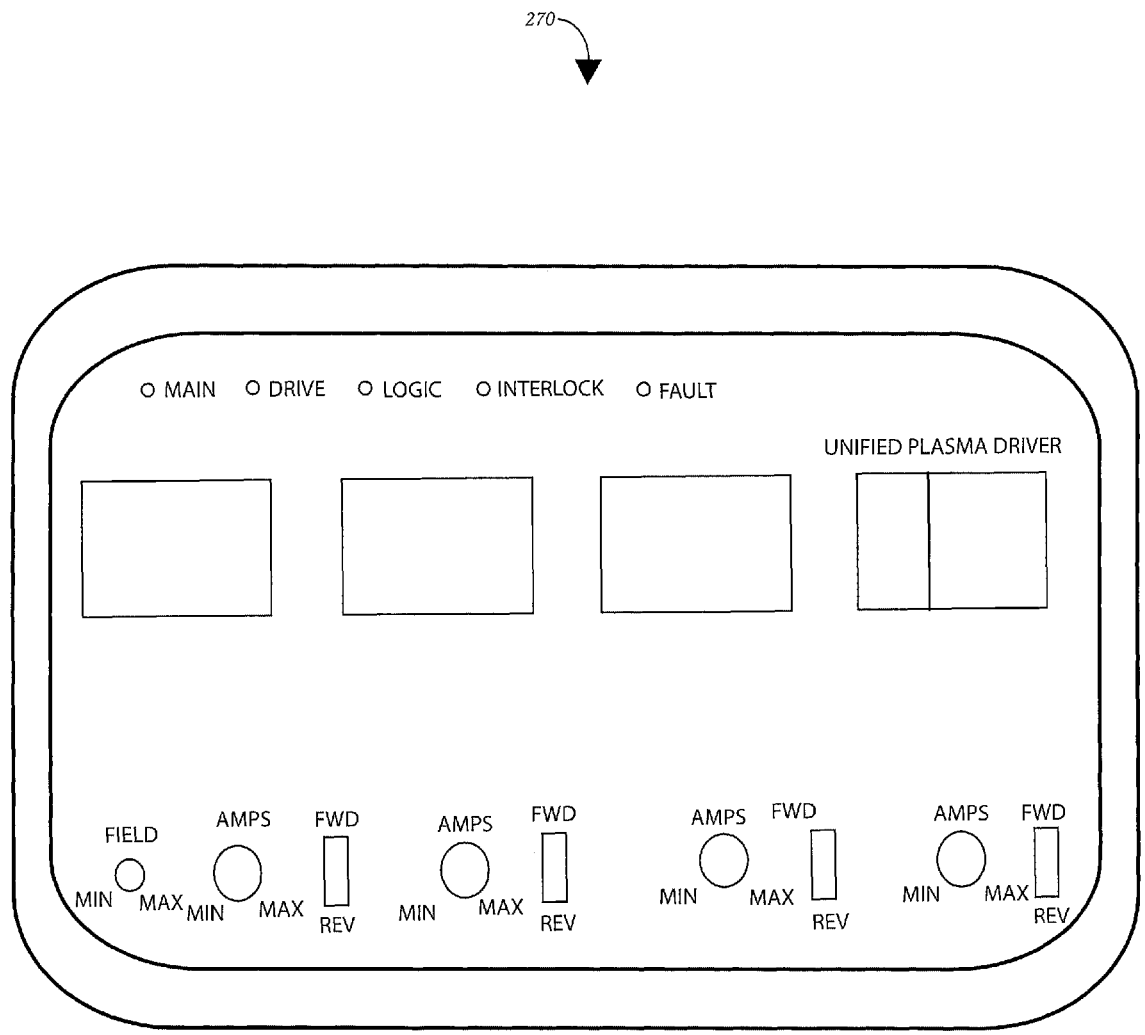
FIG. 26 is a front view of a unified plasma driver unit associated with the logic controlled power supply of the present invention.

FIGS. 25 and 26 illustrate a phased plasma driver unit 260 and a unified plasma unit 270 associated with the logic controlled power supply 80. Phased plasma driver unit 260 allows frequencies to be selected over a predefined set of ranges such as 0.02-0.2, 0.2-2, 2-20, and 20-200 Hz. Frequency or manual positioning may be used for generating the driving signals. A plurality of status LEDs are provided for indications such as main, drive, logic and the like. The unified plasma driver unit 270 provides each module to select current range and mode of winding of respective coil sets. The selection of modules in different combinations determines the energizing of selected coil sets resulting in higher angle particle ejection contributing to a greater utilization of target material.

The foregoing written description describes a device for controlling sputter coating deposition for providing uniform deposition of target material onto a substrate. Finally, although the description above contains many specificities, these should not be construed as limiting the scope of the invention, but as merely providing illustrations of some of the presently preferred embodiments of this invention. This invention may be altered and rearranged in numerous ways by one skilled in the art without departing from the coverage of any patent claims which are supported by this specification.

The invention claimed is:

1. A device for controlling sputter coating deposition to at least one surface of at least one substrate, said device comprising:
    a magnetic structure having a plurality of electrically isolated and magnetically coupled magnetic pole piece structures arranged in a spoke fashion, said magnetic structure including:
    at least one target surface having a mounting means for positioning at least one target;
    a plurality of magnetic concentric rings mounted behind said at least one target surface;
    a central upright common magnetic core traversing along a longitudinal axis connecting said plurality of magnetic pole piece structures;
    a plurality of upright pole pieces arranged parallel to each other and attached to each of said plurality of magnetic pole piece structures, so that the plurality of upright pole pieces are arranged at midpoints of said plurality of magnetic concentric rings;
    a plurality of electromagnetic coils having a first set of forward windings, a second set of reverse windings and a third set of reverse null windings on each of said plurality of magnetic pole piece structures between each of said plurality of upright pole pieces; and
    a logic controlled power supply that drives said plurality of electromagnetic coils;
    whereby a phased operation utilizing at least one of a plurality of operational modes is applied to said plurality of electromagnetic coils for maintaining a plasma generation field over said at least one target surface thereby allowing for tuning an angle or trajectory of a plurality of particles ejected from said at least one target surface.

2. The device as recited in claim 1, wherein said at least one target may be a non-magnetic or a magnetic material that utilizes a magnetic fringing field for assisting generation of said plasma generation field sufficient to erode said target material.

3. The device as recited in claim 1, wherein said plasma generation field in conjunction with a negative DC voltage potential on said at least one target surface forms a space charge accelerator.

4. The device as recited in claim 1, wherein said magnetic concentric rings have equal areas that result in equal densities of magnetic flux lines.

5. The device as recited in claim 1, wherein the plurality of magnetic concentric rings has an inner most ring and an outer most ring, each possessing one half as much surface area as that of an intermediate ring.

6. The device as recited in claim 1, wherein said plurality of magnetic concentric rings includes an air gap between each adjacent pair of said plurality of upright pole pieces that facilitate generation of a balanced magnetic field.

7. The device as recited in claim 1, wherein a number of ring pairs in the plurality of magnetic concentric rings is selected according to an increase or decrease in a number of electromagnetic coil sets.

8. The device as recited in claim 1, wherein said plurality of magnetic concentric rings have a flat shape for influencing magnetic field shape and minimizing losses at air gaps.

9. The device as recited in claim 1, wherein said plurality of magnetic concentric rings have a beveled shape for influencing magnetic field shape and minimizing losses at air gaps.

10. The device as recited in claim 1, wherein a shape of a magnetic field is adjusted along at least one diameter by utilizing variations in a plurality of ring electromagnetic coil levels utilizing to deposit a plurality of thin films at different diameters on said at least one substrate.

11. The device as recited in claim 1, wherein said plasma generation field extends from across a broad area rendering a uniform deposition over said at least one target surface thereby accomplishing higher target utilization.

12. The device as recited in claim 1, wherein said plurality of magnetic pole piece structures, said plurality of upright pole pieces and said plurality of magnetic concentric rings is made from a magnetic material.

13. The device as recited in claim 1, wherein said logic controlled power supply may be configured to function on an analog logic or on a digital logic.

14. The device as recited in claim 1, wherein said magnetic structure includes said plurality of magnetic pole piece structures wound with said plurality of electromagnetic coils sized for voltage and/or current signals generated from said logic controlled power supply.

15. The device as recited in claim 1, wherein at least one of the sets of electromagnetic coils incorporates additional windings that are controlled independently.

16. The device as recited in claim 1, wherein a magnetic field generated is more parallel than parabolic, resulting in a broad erosion area on said at least one target surface.

17. The device as recited in claim 16, wherein said magnetic field is generated across a broad area, said magnetic field being moved across said at least one target surface from ID to OD to ID of said plurality of magnetic concentric rings whereby ID and OD are inner and outer diameter respectively.

18. The device as recited in claim 16, wherein said magnetic field generated across said broad erosion area has a moving field sufficient to superimpose on said at least one target causing broad area erosion that allows a degree of lower angle deposition thereby allowing high deposition rates with conformal coating benefits.

19. The device as recited in claim 16, wherein said magnetic field generated across said broad erosion area has a modulated field sufficient to superimpose on said at least one target causing acceleration of a plurality of electrons and a denser magnetic flux that adds a component of directionality to a plurality of deposition particles allowing a conformal coverage.

20. The device as recited in claim 19, wherein said magnetic field generated across said broad erosion area having said modulated field moves in a circular fashion sufficient to superimpose on said at least one target resulting in acceleration of said plurality of electrons and adding the component of directionality.

21. The device as recited in claim 1, wherein said logic controlled power supply includes at least one DC power source for generating sufficient level of voltage and/or current signal and a plurality of logic circuits, said plurality of logic circuits may be combined in various configurations to manipulate a magnetic field.

22. The device as recited in claim 21, wherein said plurality of logic circuits may generate a fixed signal with a modulated signal superimposed thereon, said fixed signal being a summing current that drives said magnetic structure.

23. The device as recited in claim 22, wherein said fixed signal is a summing voltage signal that drives said magnetic structure.

24. The device as recited in claim 21, wherein said logic controlled power supply generates a plurality of outputs, said plurality of outputs is controlled either independently or simultaneously.

25. The device as recited in claim 24, wherein said plurality of outputs has the ability to phase magnetic field lines of at least one set of electromagnetic coils into other magnetic field lines of an adjacent set of electromagnetic coils, thereby maintaining a confined plasma density over the at least one target surface.

26. The device as recited in claim 1, wherein said plurality of electromagnetic coils are phased in a controlled ramp up and ramp down sequence so as to move a plurality of magnetic flux lines across said at least one target surface, said plurality of magnetic flux lines control rate of motion of a plasma density above said at least one target surface.

27. The device as recited in claim 26, wherein said controlled ramp up and ramp down sequence is applied to reverse windings to contain a magnetic field generated by said plurality of electromagnetic coils.

28. The device as recited in claim 1, wherein said phased operation functions in at least one of said plurality of operational modes for augmenting acceleration of a plurality of electrons thereby achieving effective target utilization and uniformity adjustment.

29. The device as recited in claim 28, wherein said plurality of operational modes are a phased sweep mode, a uni-plasma mode, a uni-plasma with phased acceleration mode, a uni-plasma with amplitude modulation mode, and a uni-plasma with rotational acceleration mode.

30. The device as recited in claim 29, wherein said uni-plasma with phased acceleration mode operates by a combination of forward biasing applied to at least one set of electromagnetic coils inducing a phased sweep current to said at least one set of electromagnetic coils, a percentage of said phased sweep current is superimposed to generate a summed current having a constant current which may be adjustable and capable to function as a carrier of another summed current that may be phased over said at least one set of electromagnetic coils in a controlled manner.

31. The device as recited in claim 30, wherein said combination renders more flexibility and control over said angle or trajectory of particles ejected from said at least one target surface for conformal coating with better uniformity.

32. The device as recited in claim 29, wherein said uniplasma with amplitude modulation mode functions in a forward bias applied to at least one set of electromagnetic coils simultaneously, causing a superimposition of a plurality of current signals generating a variable riding current that accelerates said plurality of electrons in both high and low angle magnetic field lines, thereby providing a fine control over direction of said plurality of ejected particles from said at least one target.

33. The device as recited in claim 32, wherein said uniplasma with amplitude modulation mode also functions with a phased pulse current riding in a circular manner in which at least one of said plurality of magnetic pole piece structures is pulsed in a rotational manner causing localized randomization and acceleration, which moves plasma density around thereby facilitating controlled frequency and amplitude that derives desired deposition effects of said target material.

34. The device as recited in claim 29, wherein said uniplasma with rotational acceleration mode operates by an arrangement having a south pole positioned on an inner diameter (ID) of the at least one target surface and a north pole positioned on at least one perimeter of the at least one target surface, said arrangement in conjunction with an induced current and a magnetic field generated by a plasma density develops a balanced magnetic field.

35. The device as recited in claim 29, wherein said phased sweep mode augments a radial translational motion of said plurality of electrons that spin along magnetic flux lines around a moving magnetic field, said radial translational motion being perpendicular to said at least one target surface.

36. The device as recited in claim 29, wherein said uniplasma mode functions in a forward biasing and a reverse biasing being applied to said plurality of electromagnetic coils arranged on said plurality of magnetic pole piece structures.

37. The device as recited in claim 36, wherein said reverse biasing is applied to at least one outer electromagnetic coil associated with said plurality of magnetic concentric rings facilitates shifting of an erosion area on said at least one target.

38. The device as recited in claim 36, wherein said forward biasing generates a broad flat magnetic field across a large area of said at least one target, said plurality of magnetic pole piece structures and said plurality of magnetic concentric rings facilitate tilting and/or shifting of said broad flat magnetic field above said at least one target thereby adjusting a plurality of angles of particle ejection from said at least one target.

39. The device as recited in claim 38, wherein said forward biasing and said reverse biasing achieve movement and shaping of said broad flat magnetic field across said central upright common magnetic core without using any external means.

* * * * *